US 10,868,172 B2

(12) United States Patent
Blank et al.

(10) Patent No.: US 10,868,172 B2
(45) Date of Patent: *Dec. 15, 2020

(54) VERTICAL POWER DEVICES WITH OXYGEN INSERTED SI-LAYERS

(71) Applicant: Infineon Technologies Austria AG, Villach (AT)

(72) Inventors: Oliver Blank, Villach (AT); Thomas Feil, Villach (AT); Maximilian Roesch, St. Magdalen (AT); Martin Poelzl, Ossiach (AT); Robert Haase, San Pedro, CA (US); Sylvain Leomant, Poertschach am Woerthersee (AT); Bernhard Goller, Villach (AT); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/718,748

(22) Filed: Dec. 18, 2019

(65) Prior Publication Data

US 2020/0127134 A1 Apr. 23, 2020

Related U.S. Application Data

(63) Continuation of application No. 16/058,631, filed on Aug. 8, 2018, now Pat. No. 10,580,888.

(51) Int. Cl.
*H01L 29/78* (2006.01)
*H01L 21/76* (2006.01)
(Continued)

(52) U.S. Cl.
CPC .... *H01L 29/7813* (2013.01); *H01L 21/02323* (2013.01); *H01L 21/3063* (2013.01);
(Continued)

(58) Field of Classification Search
CPC ... H01L 29/08; H01L 29/085; H01L 29/0856; H01L 29/10; H01L 29/103;
(Continued)

(56) References Cited

U.S. PATENT DOCUMENTS 6,404,007 B1 6/2002 Mo et al.
7,858,478 B2 12/2010 Hirler
(Continued)

FOREIGN PATENT DOCUMENTS

| DE | 102006002903 A1 | 8/2007 |
| DE | 102007044414 A1 | 3/2009 |
| WO | 2009079465 A1 | 6/2009 |

OTHER PUBLICATIONS

Shao, Lin, et al., "Boron diffusion in silicon: the anomalies and control by point defect engineering", Reports: A Review Journal, Materials Science and Engineering R 42, Aug. 11, 2003, pp. 65-114.
(Continued)

*Primary Examiner* — Monica D Harrison
(74) *Attorney, Agent, or Firm* — Murphy, Bilak & Homiller, PLLC

(57) ABSTRACT

A semiconductor device includes: a gate trench extending into a Si substrate; a body region in the Si substrate, the body region including a vertical channel region adjacent a sidewall of the gate trench; a source region in the Si substrate above the body region; a contact trench extending into the Si substrate and separated from the gate trench by a portion of the source region and by a portion of the body region; an electrically conductive material in the contact trench; and a diffusion barrier structure interposed between a sidewall of the contact trench and the vertical channel region, the diffusion barrier structure including alternating layers of Si and oxygen-doped Si and configured to increase carrier
(Continued)

mobility within the vertical channel region. Corresponding methods of manufacture are also described.

23 Claims, 25 Drawing Sheets

(51) Int. Cl.
| | |
|---|---|
| *H01L 21/02* | (2006.01) |
| *H01L 21/3063* | (2006.01) |
| *H01L 21/768* | (2006.01) |
| *H01L 29/08* | (2006.01) |
| *H01L 29/10* | (2006.01) |
| *H01L 29/66* | (2006.01) |

(52) U.S. Cl.
CPC .. *H01L 21/76831* (2013.01); *H01L 21/76832* (2013.01); *H01L 21/76843* (2013.01); *H01L 21/76877* (2013.01); *H01L 29/0856* (2013.01); *H01L 29/1033* (2013.01); *H01L 29/1095* (2013.01); *H01L 29/66734* (2013.01)

(58) Field of Classification Search
CPC .............. H01L 29/1033; H01L 29/109; H01L 29/1095; H01L 29/66; H01L 29/667; H01L 29/6673; H01L 29/66734; H01L 29/78; H01L 29/781; H01L 29/7813; H01L 21/02; H01L 21/023; H01L 21/0232; H01L 21/02323; H01L 21/76; H01L 21/768; H01L 21/7683; H01L 21/76831; H01L 21/76832; H01L 21/7684; H01L 21/76843; H01L 21/7687; H01L 21/76877
USPC ......................................................... 257/330
See application file for complete search history.

(56) References Cited

U.S. PATENT DOCUMENTS

| | | | |
|---|---|---|---|
| 8,067,800 | B2 | 11/2011 | Hsieh |
| 10,510,836 | B1 | 12/2019 | Haase et al. |
| 10,573,742 | B1 | 2/2020 | Feil et al. |
| 10,580,888 | B1 * | 3/2020 | Blank .............. H01L 21/76843 |
| 2004/0031987 | A1 | 2/2004 | Henninger et al. |
| 2004/0166636 | A1 | 8/2004 | Darwish |
| 2005/0167742 | A1 | 8/2005 | Challa et al. |
| 2007/0249142 | A1 | 10/2007 | Hisanaga |
| 2012/0061754 | A1 | 3/2012 | Hsieh |
| 2012/0064684 | A1 | 3/2012 | Hsieh |
| 2012/0074489 | A1 | 3/2012 | Hsieh |
| 2012/0187477 | A1 | 7/2012 | Hsieh |
| 2012/0280293 | A1 | 11/2012 | Pan |
| 2013/0168760 | A1 | 7/2013 | Hsieh |
| 2013/0313632 | A1 | 11/2013 | Schulze et al. |
| 2015/0270378 | A1 | 9/2015 | Konishi et al. |
| 2017/0263720 | A1 | 9/2017 | Hirler et al. |

OTHER PUBLICATIONS

Datta, Suman, "Mitigation of Intrinsic Vt Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018.
Feil, Thomas, et al., "Oxygen Inserted Si-Layers in Vertical Trench Power Devices", U.S. Appl. No. 16/058,655, filed Aug. 8, 2018.
Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.
Poelzl, Martin, et al., "Oxygen Inserted Si-Layers for Reduced Substrate Dopant Outdiffusion in Power Devices", U.S. Appl. No. 16/058,593, filed Aug. 8, 2018.
Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28-Mar. 2, 2017, pp. 1-6.
Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.
Xu, N., et al., "MOSFET Performance and Scalability Enhancement by Insertion of Oxygen Layers", 2012 International Electron Devices Meeting, San Francisco, CA, USA, Dec. 2012.

* cited by examiner

VERTICAL POWER DEVICES WITH OXYGEN INSERTED SI-LAYERS

BACKGROUND

As the dimensions of trench-based transistors shrink, the influence of the highly-doped source/body contact on the net body doping near the channel region becomes more important. For wider lateral distribution of the source/body contact diffusion with 2-3 orders of magnitude higher doping levels compared to the body doping, Vth (threshold voltage) and RonA (on-state resistance) of the device increases. Increasing the distance between the source/body contact and the channel region causes depletion of the body at high drain voltages which can lead to high DIBL (drain-induced barrier lowering). Furthermore, the process window variation for both trench width and contact width as well as contact misalignment must become smaller to avoid these adverse effects (higher Vth, higher RonA and higher DIBL).

Hence, better control of the lateral out-diffusion of the source/body contact doping is desirable.

SUMMARY

According to an embodiment of a semiconductor device, the semiconductor device comprises: a gate trench extending into a Si substrate; a body region in the Si substrate, the body region including a channel region which extends along a sidewall of the gate trench; a source region in the Si substrate above the body region; a contact trench extending into the Si substrate and separated from the gate trench by a portion of the source region and a portion of the body region, the contact trench being filled with an electrically conductive material which contacts the source region at a sidewall of the contact trench and a highly doped body contact region at a bottom of the contact trench; and a diffusion barrier structure formed along the sidewall of the contact trench and disposed between the highly doped body contact region and the channel region, the diffusion barrier structure comprising alternating layers of Si and oxygen-doped Si.

In an embodiment, the diffusion barrier structure may extend along the bottom of the contact trench.

Separately or in combination, the highly doped body contact region may be only laterally confined by the diffusion barrier structure which is absent from the bottom of the contact trench.

Separately or in combination, the electrically conductive material which fills the contact trench may extend onto a front main surface of the Si substrate beyond the diffusion barrier structure and in a direction toward the gate trench.

Separately or in combination, the diffusion barrier structure may comprise a capping layer of Si epitaxially grown on the alternating layers of Si and oxygen-doped Si.

Separately or in combination, the Si substrate may comprise one or more Si epitaxial layers grown on a base Si substrate.

According to an embodiment of a method of manufacturing a semiconductor device, the method comprises: forming a gate trench which extends into a Si substrate; forming a contact trench which extends into the Si substrate and is separate from the gate trench; forming a highly doped body contact region in the Si substrate at a bottom of the contact trench; forming a diffusion barrier structure along a sidewall of the contact trench, the diffusion barrier structure comprising alternating layers of Si and oxygen-doped Si; forming a body region in the Si substrate, the body region including a channel region which extends along a sidewall of the gate trench; forming a source region in the Si substrate above the body region; and filling the contact trench with an electrically conductive material which contacts the source region at the sidewall of the contact trench and the highly doped body contact region at the bottom of the contact trench.

In an embodiment, forming the diffusion barrier structure may comprise, before filling the contact trench with the electrically conductive material, epitaxially growing the alternating layers of Si and oxygen-doped Si on the sidewall and the bottom of the contact trench.

Separately or in combination, the method may further comprise epitaxially growing a capping layer of Si on the alternating layers of Si and oxygen-doped Si.

Separately or in combination, forming the highly doped body contact region may comprise implanting a dopant species into the alternating layers of Si and oxygen-doped Si at the bottom of the contact trench and annealing the Si substrate to activate the implanted dopant species.

Separately or in combination, the method may further comprises removing the alternating layers of Si and oxygen-doped Si from at least part of the bottom of the contact trench.

Separately or in combination, removing the alternating layers of Si and oxygen-doped Si from at least part of the bottom of the contact trench may comprise: epitaxially growing a capping layer of Si on the alternating layers of Si and oxygen-doped Si; depositing a conformal spacer oxide on the capping layer of Si; anisotropically etching the conformal spacer oxide to expose the diffusion barrier structure at the bottom of the contact trench; etching away the exposed diffusion barrier structure at the bottom of the contact trench; and after etching away the exposed diffusion barrier structure at the bottom of the contact trench, removing the conformal spacer oxide.

Separately or in combination, forming the diffusion barrier structure may comprise, before filling the contact trench with the electrically conductive material, epitaxially growing the alternating layers of Si and oxygen-doped Si only on the sidewall and not the bottom of the contact trench.

Separately or in combination, the method may further comprise epitaxially growing a capping layer of Si on the alternating layers of Si and oxygen-doped Si.

Separately or in combination, forming the highly doped body contact region may comprise implanting a dopant species into a region of the bottom of the contact trench which is devoid of the alternating layers of Si and oxygen-doped Si and annealing the Si substrate to activate the implanted dopant species.

Separately or in combination, the method may further comprise, before filling the contact trench with the electrically conductive material, etching back an insulating layer formed on a front main surface of the Si substrate so that the insulating layer has an opening which is aligned with the contact trench and wider than a combined width of the contact trench and the diffusion barrier structure.

Separately or in combination, filling the contact trench with the electrically conductive material may comprise depositing the electrically conductive material in the contact trench and in the opening formed in the insulating layer, so that the electrically conductive material extends onto the front main surface of the Si substrate beyond the diffusion barrier structure and in a direction toward the gate trench.

Separately or in combination, forming the diffusion barrier structure may comprise, before forming the body and the source regions, epitaxially growing the alternating layers of Si and oxygen-doped Si on the sidewall and the bottom of the contact trench.

Separately or in combination, the method may further comprise, before forming the body and the source regions, epitaxially growing a capping layer of Si on the alternating layers of Si and oxygen-doped Si.

Separately or in combination, the method may further comprise removing the alternating layers of Si and oxygen-doped Si from at least part of the bottom of the contact trench.

Separately or in combination, removing the alternating layers of Si and oxygen-doped Si from at least part of the bottom of the contact trench may comprise: epitaxially growing a capping layer of Si on the alternating layers of Si and oxygen-doped Si; depositing a conformal spacer oxide on the capping layer of Si; anisotropically etching the conformal spacer oxide to expose the diffusion barrier structure at the bottom of the contact trench; etching away the exposed diffusion barrier structure at the bottom of the contact trench; and after etching away the exposed diffusion barrier structure at the bottom of the contact trench, removing the conformal spacer oxide.

Separately or in combination, forming the diffusion barrier structure may comprise: before forming the body and the source regions, forming a sacrificial insulating layer at the bottom of the contact trench; after forming the sacrificial insulating layer, epitaxially growing the alternating layers of Si and oxygen-doped Si on the sidewall of the contact trench; and after epitaxially growing the alternating layers of Si and oxygen-doped Si, removing the sacrificial insulating layer from the bottom of the contact trench.

Separately or in combination, the method may further comprises: after forming the diffusion barrier structure and before forming the source and the body regions, filling the contact trench with a sacrificial plug material; after filling the contact trench with the sacrificial plug material, forming the source and the body regions in the Si substrate; after forming the source and the body regions, removing the sacrificial plug material; after removing the sacrificial plug material and before filling the contact trench with the electrically conductive material, implanting a dopant species into the bottom of the contact trench; and annealing the Si substrate to activate the implanted dopant species to form the highly doped body contact region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

Embodiments described herein control lateral out-diffusion of the source/body contact doping for trench-based transistors, allowing for narrower Vth, RonA and DIBL distributions for a given geometry variation for the highly-doped source/body contact and gate trench, and/or allowing for a lateral spacing reduction between the source/body contact and channel region of the device for given Vth, RonA and DIBL windows. The lateral out-diffusion of the source/body contact doping is better controlled by inserting a diffusion barrier structure which comprises alternating layers of Si and oxygen-doped Si between the highly doped source/body contact and the channel region of the device. The oxygen-doped Si layers of the diffusion barrier structure limit the lateral out-diffusion of the source/body contact doping, thereby controlling the lateral out-diffusion of the source/body contact doping in a direction towards the channel region. The diffusion barrier structure enables, for example, narrower Vth distribution for a narrow-trench MOSFET, or for a predetermined Vth distribution width, a smaller distance between the contact trench and the gate trench. Described next in more detail are embodiments of semiconductor devices with such a diffusion barrier structure, and corresponding methods of manufacture.

Figure 1:
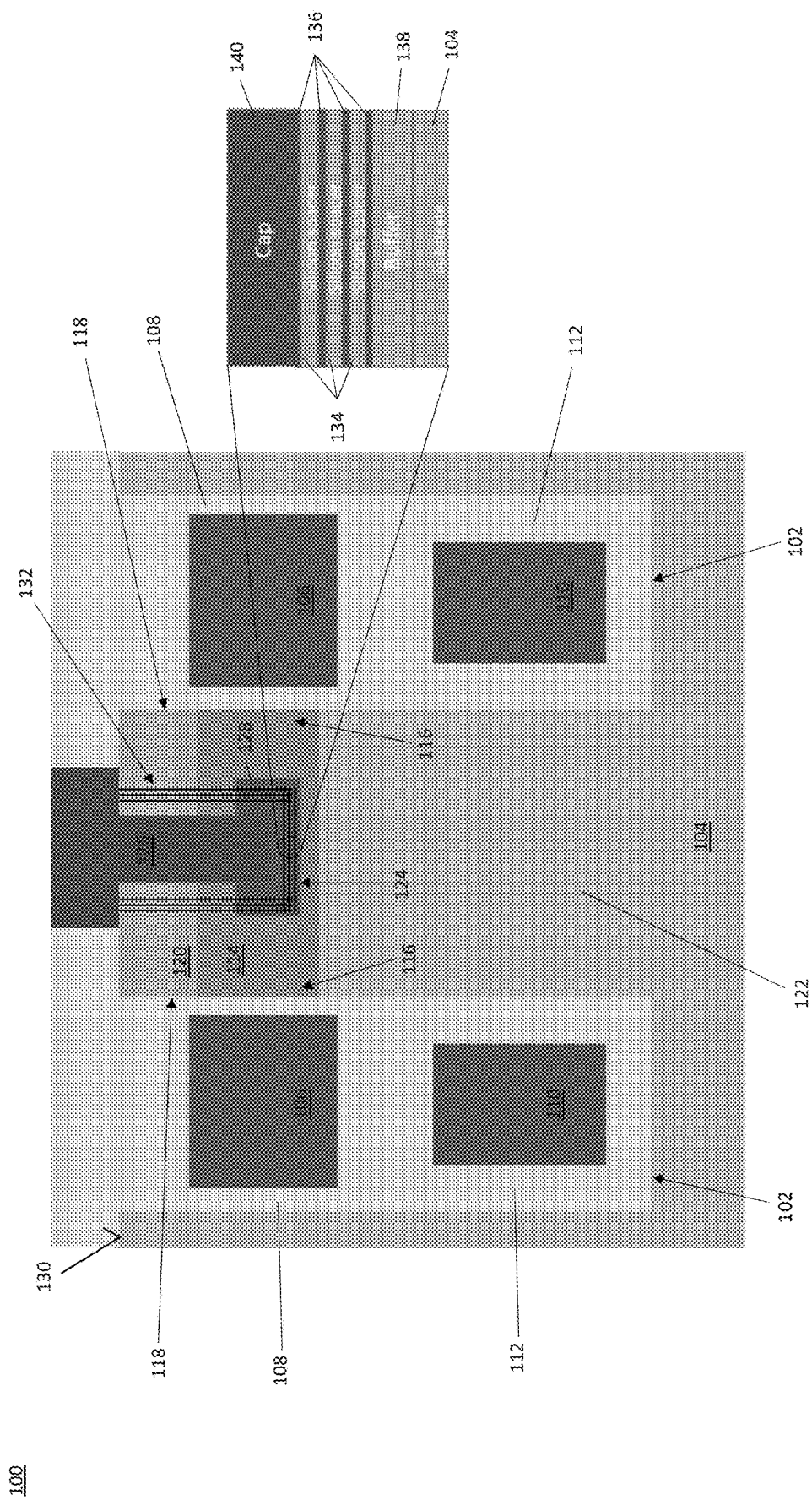
FIG. 1 illustrates a partial cross-sectional view of an embodiment of a trench-based semiconductor device having a diffusion barrier structure.

FIG. 1 illustrates a partial cross-sectional view of an embodiment of a trench-based semiconductor device 100. The semiconductor device 100 includes one or more gate trenches 102 extending into a Si substrate 104. The Si substrate 104 may comprise one or more Si epitaxial layers grown on a base Si substrate. A gate electrode 106 disposed in each gate trench 102 is insulated from the surrounding semiconductor material by a gate dielectric 108. A field electrode 110 may be disposed in each gate trench 102 below the corresponding gate electrode 106, and insulated from the surrounding semiconductor material and the gate electrode 106 by a field dielectric 112. The gate and field dielectrics 108, 112 may comprise the same or different materials, and may have the same or different thicknesses. The field electrode 110 instead may be formed in a different trench separate from the gate trench 102, or omitted altogether depending on the type of semiconductor device. The trench-based semiconductor device 100 may be a power semiconductor device such as a power MOSFET (metal-oxide-semiconductor field effect transistor), an IGBT (insulated gate bipolar transistor), etc.

The trench-based semiconductor device 100 further includes a body region 114 formed in the Si substrate 104. The body region 114 includes a channel region 116 which vertically extends along the sidewall 118 of the corresponding gate trench 102. The semiconductor device 100 also includes a source region 120 formed in the Si substrate 104 above the body region 114. Vertical current flow through the channel region 116 is controlled by applying a gate potential to the gate electrode 106. A drain or collector region (not shown) is formed below the drift zone 122. Depending on the type of device, additional structures may be formed in the drift zone 122 and/or between the drift zone 122 and the drain/collector region. For example, charge compensation structures may be formed in the drift zone 122 and/or a field stop layer may be formed between the drift zone 122 and the drain/collector region in the case of an IGBT type device. Again, any type of semiconductor device with a trench gate may utilize the diffusion barrier teachings described herein.

The trench-based semiconductor device 100 further includes a contact trench 124 which extends into the Si substrate 104. The contact trench 124 is separated from each adjacent gate trench 102 by a portion of the source region 120 and a portion of the body region 114. The contact trench 124 is filled with an electrically conductive material 126 such as doped polysilicon, metal, etc. which contacts the source region 120 at the sidewall of the contact trench 124 and a highly doped body contact region 128 at the bottom of the contact trench 124. The electrically conductive material 126 which fills the contact trench 124 may extend onto the front main surface 130 of the Si substrate 104 beyond the diffusion barrier structure 132 and in a direction toward the gate trench 102, so that the electrically conductive material 126 contacts the source region 120 along the front main surface 130 of the Si substrate 104 between the gate trench 102 and the diffusion barrier structure 132.

The highly doped body contact region 128 at the bottom of the contact trench 124 has the same doping type as the body region 114, but at a higher concentration to provide good ohmic contact with the electrically conductive material 126 which fills the contact trench 124. For example, in the case of an n-channel device, the source region 120 and drift zone 122 are doped n-type and the body region 114, channel region 116 and highly doped body contact region 128 are doped p-type. Conversely, in the case of an p-channel device, the source region 120 and drift zone 122 are doped p-type and the body region 114, channel region 116 and highly doped body contact region 128 are doped n-type.

In either case, the diffusion barrier structure 132 is formed along at least the sidewall of the contact trench 124 and disposed between the highly doped body contact region 126 and the channel region 116. The diffusion barrier structure 132 may also extend along the bottom of the contact trench 124 as shown in FIG. 1, along just the sidewall, or along the sidewall and only part of the bottom as described in more detail later herein.

The diffusion barrier structure 132 comprises alternating layers of Si 134 and oxygen-doped Si 136. The alternating layers of Si 134 and oxygen-doped Si 136 form an oxygen-doped silicon region grown by epitaxy. In an embodiment, the oxygen concentration for each oxygen-doped Si layer 136 is below 5e14 cm-3. Each oxygen-doped Si layer 136 may have a thickness in the atomic range (e.g. one or several atoms thick) or in the nanometer range to ensure sufficient crystal information for growing Si on the oxygen-doped Si layers 136. The alternating layers of Si 134 and oxygen-doped Si 136 may be realized by epitaxially growing Si layers alternating with oxygen layers respectively adsorbed on surfaces of the Si layers, e.g., with a particular limited thickness for the oxygen-doped Si layers 136 to ensure adequate Si growth.

FIG. 1 provides an exploded view of the diffusion barrier structure 132, which may also include a Si buffer layer 138 between the Si substrate 104 and the alternating layers of Si 134 and oxygen-doped Si 136, and/or a capping layer 140 of Si epitaxially grown on the alternating layers of Si 134 and oxygen-doped Si 136. The Si buffer layer 138 may be relatively thin, e.g., in the range of 2-5 nm thick. The Si buffer layer 138 may be grown after an implant or an etch step. The capping layer 140 provides high carrier mobility in this region of the device 100. One or both of the buffer layer 138 and the capping layer 140 may be omitted. The oxygen-doped Si layers 136 of the diffusion barrier structure 132 limit the lateral out-diffusion of the source/body contact doping, thereby controlling the lateral out-diffusion of the source/body contact doping in a direction towards the channel region 116. The oxygen-doped Si layers 136 of the diffusion barrier structure 132 may also improve carrier mobility within the vertical channel region 116 of the device 100.

The oxygen-doped Si layers 136 of the diffusion barrier structure 132 may be formed by introducing oxygen partial monolayers to a Si lattice. The oxygen atoms are interstitially placed to minimize disruption to the Si lattice. Layers of Si atoms 134 separate adjacent oxygen partial monolayers 136. The alternating layers of Si 134 and oxygen-doped Si 136 may be formed by Si epitaxy with absorption of oxygen at different steps. For example, temperature and gaseous conditions can be controlled during the epitaxy process to form the partial oxygen monolayers 136. Oxygen may be introduced/incorporated between epitaxial layers 134 of Si, e.g. by controlling the introduction of an oxygen precursor into the epitaxy chamber. The resulting barrier barrier structure 132 includes monolayers 136 that comprise mainly Si but have a doped level or concentration level of oxygen alternating with standard epitaxial layers 134 of Si without oxygen. The diffusion barrier structure 132 may also comprise a capping layer 140 of Si epitaxially grown on the alternating layers of Si 134 and oxygen-doped Si 136, or the capping layer 140 of Si may be omitted.

FIGS. 2A through 2F illustrate respective cross-sectional views of the trench-based semiconductor device 100 shown in FIG. 1 during different stages of the manufacturing process.

Figure 2A:
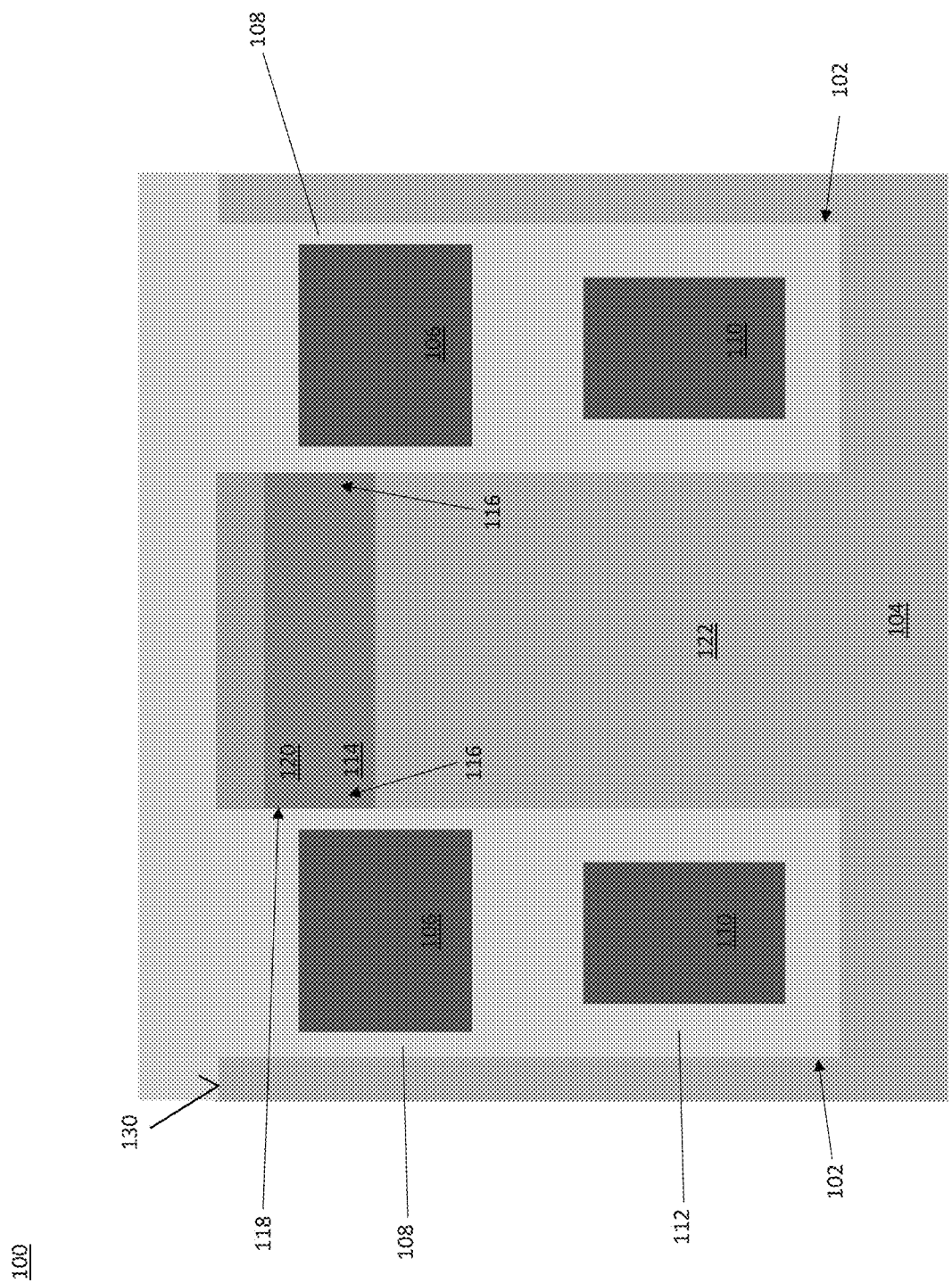
FIGS. 2A through 2F illustrate respective cross-sectional views of the trench-based semiconductor device shown in FIG. 1 during different stages of the manufacturing process.

FIG. 2A shows the device 100 after formation of the gate trenches 102, body region 114 and source region 120. Any common semiconductor manufacturing processes for forming gate trenches, body regions and source regions may be used, e.g., such as trench masking and etching, trench filling, dopant implantation and activation (annealing), etc.

Figure 2B:
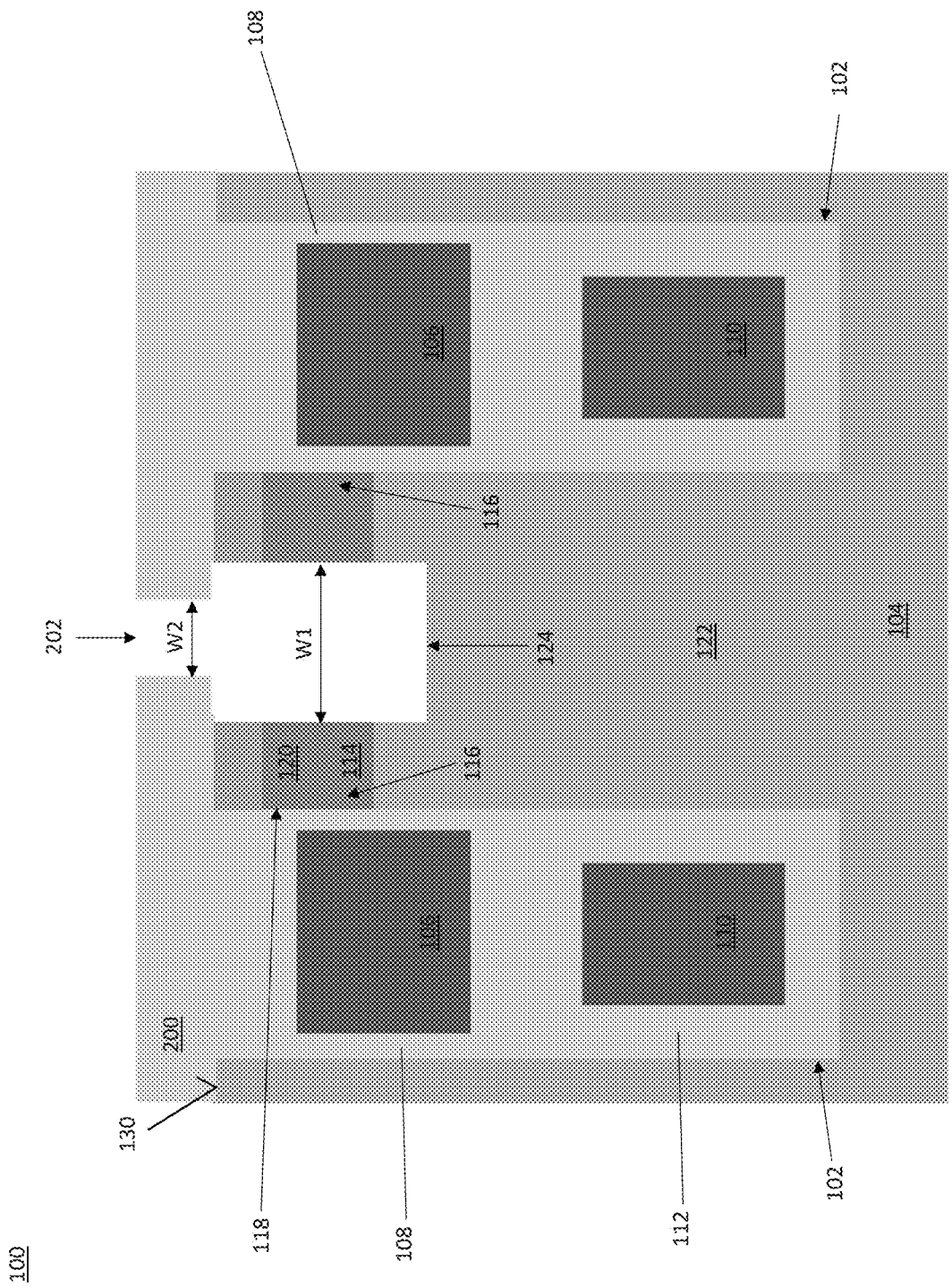

FIG. 2B shows the device 100 after the contact trench 124 is etched into the Si substrate 104 in the semiconductor mesa between adjacent gate trenches 102. Any common trench etching process may be used. For example, a hard mask/insulating layer 200 such as silicon oxide may be formed on the front main surface 130 of the Si substrate 104 and patterned to form an opening 202. The exposed part of the Si substrate 104 may then be isotropically etched to form the contact trench 124 which has a width (W1) greater than the width (W2) of the opening 202 in the hard mask 200.

Figure 2C:
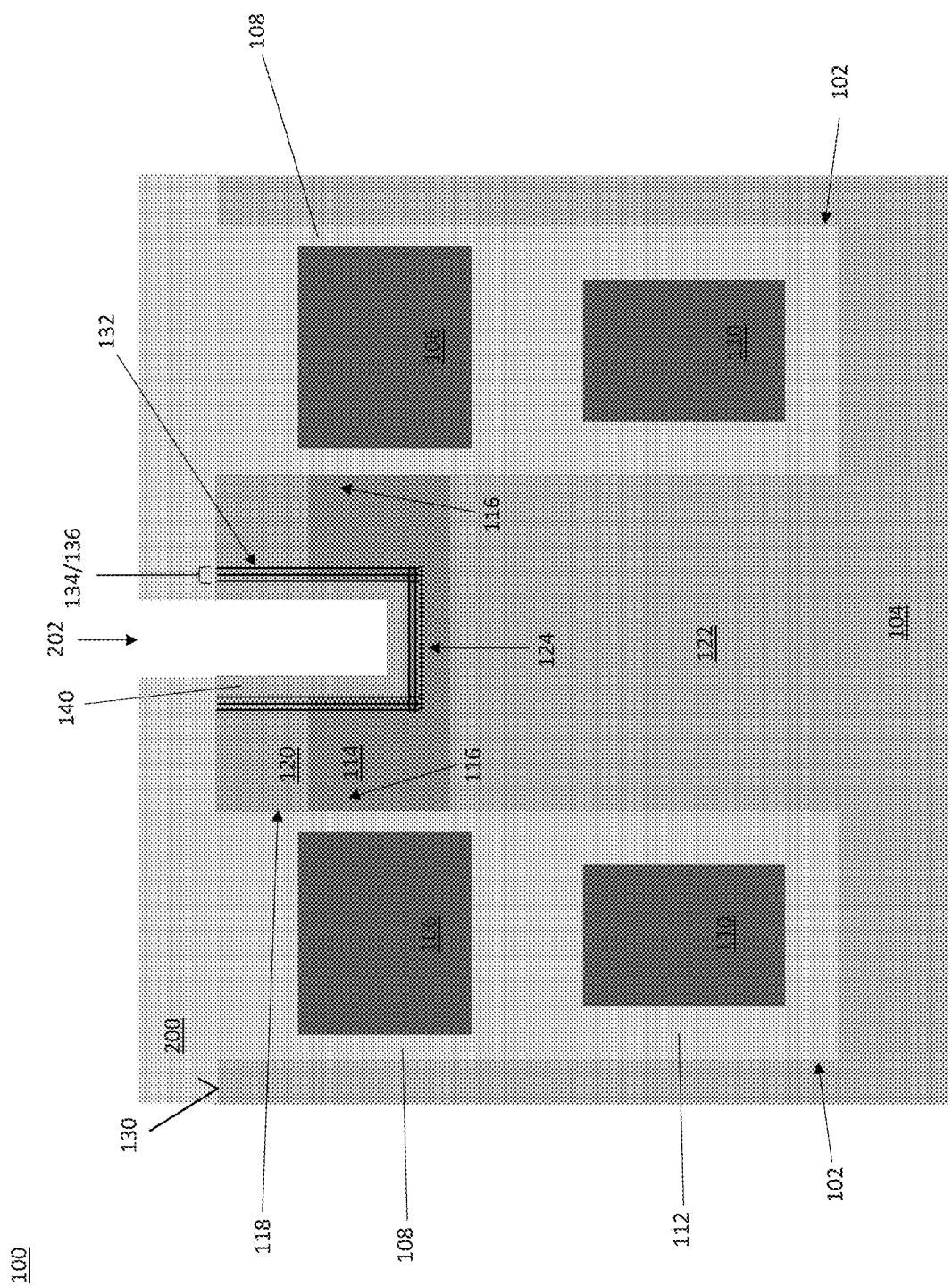

FIG. 2C shows the device 100 after the diffusion barrier structure 132 is epitaxially grown on the sidewall and bottom of the contact trench 124. The diffusion barrier structure 132 includes alternating layers of Si 134 and oxygen-doped Si 136. A capping layer 140 of Si may be epitaxially grown on the alternating layers of Si 134 and oxygen-doped Si 136. The capping layer 140 of Si may be omitted. The diffusion barrier structure 132 may be doped in situ or later with the same conductivity type as the source region 120, to provide good ohmic contact between the source region 120 and the electrically conductive material 126 subsequently deposited in the contact trench 124.

Figure 2D:
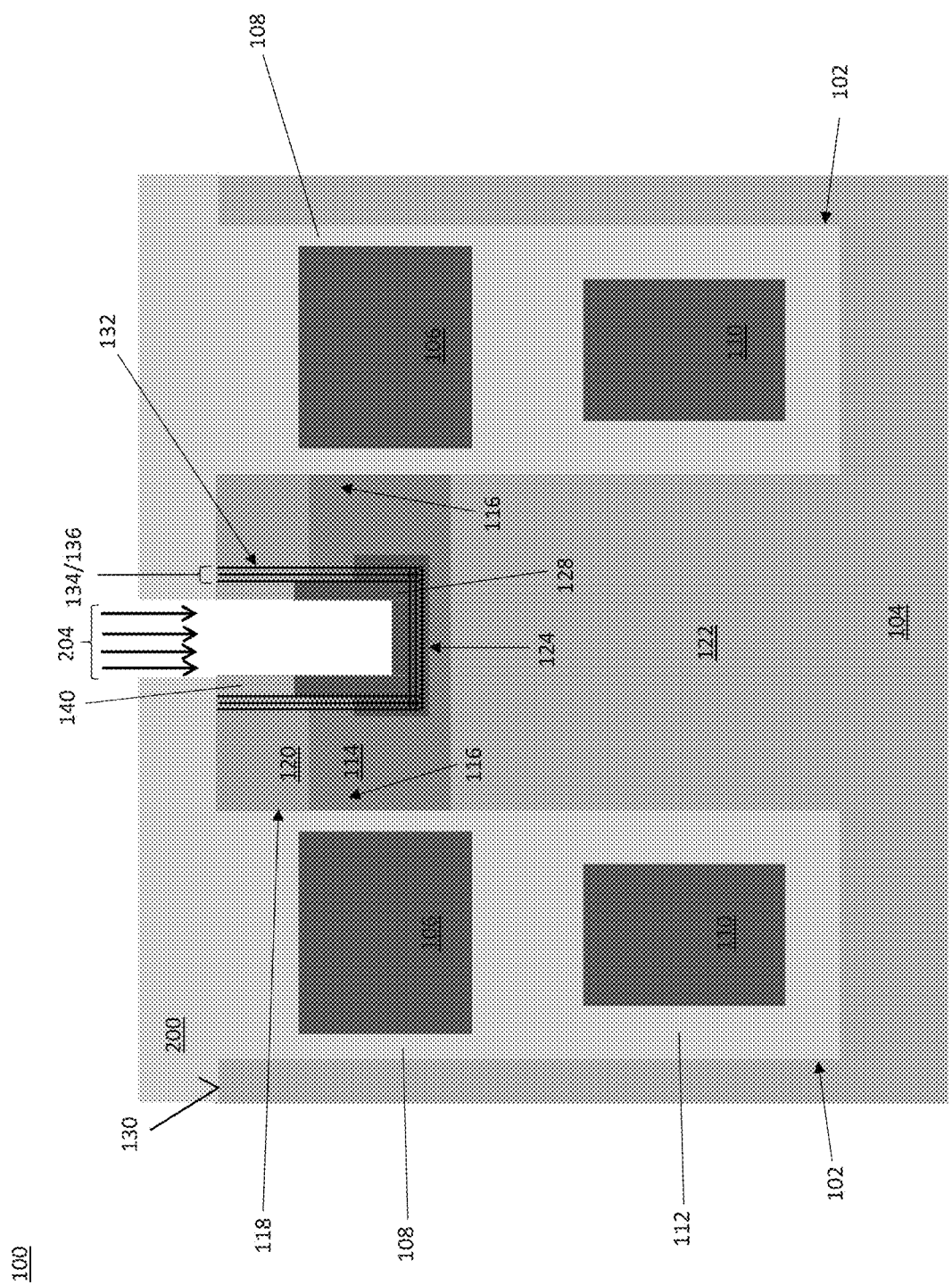

FIG. 2D shows the device 100 during implantation of the diffusion barrier structure 132 in the lower part of the contact trench 124 with dopants 204 of the same conductivity type as the body region 114, to provide good ohmic contact between the body region 114 and the electrically conductive material 126 subsequently deposited in the contact trench 124. Activation of the implanted dopants 204 by annealing forms a highly doped body contact region 128 at the bottom of the contact trench 124 with the same doping type as the body region 114, but at a higher concentration to provide good ohmic contact with the electrically conductive material 126 subsequently deposited in the contact trench 124. The oxygen-doped Si layers 136 of the diffusion barrier structure 132 limit the lateral out-diffusion of the source/body contact doping, thereby controlling the lateral out-diffusion of the source/body contact doping in a direction towards the channel region 116. In one embodiment, the diffusion barrier structure 132 is present at the bottom of the contact trench 124 as shown in FIG. 2D. According to this embodiment, the oxygen-doped Si layers 136 of the diffusion barrier structure 132 also limit the vertical out-diffusion of the source/body contact doping in a direction towards the drift zone 122. In embodiments described in more detail later herein, the diffusion barrier structure 132 is partly or completely omitted from the bottom of the contact trench 124 and therefore does not limit the vertical out-diffusion of the source/body contact doping.

Figure 2E:
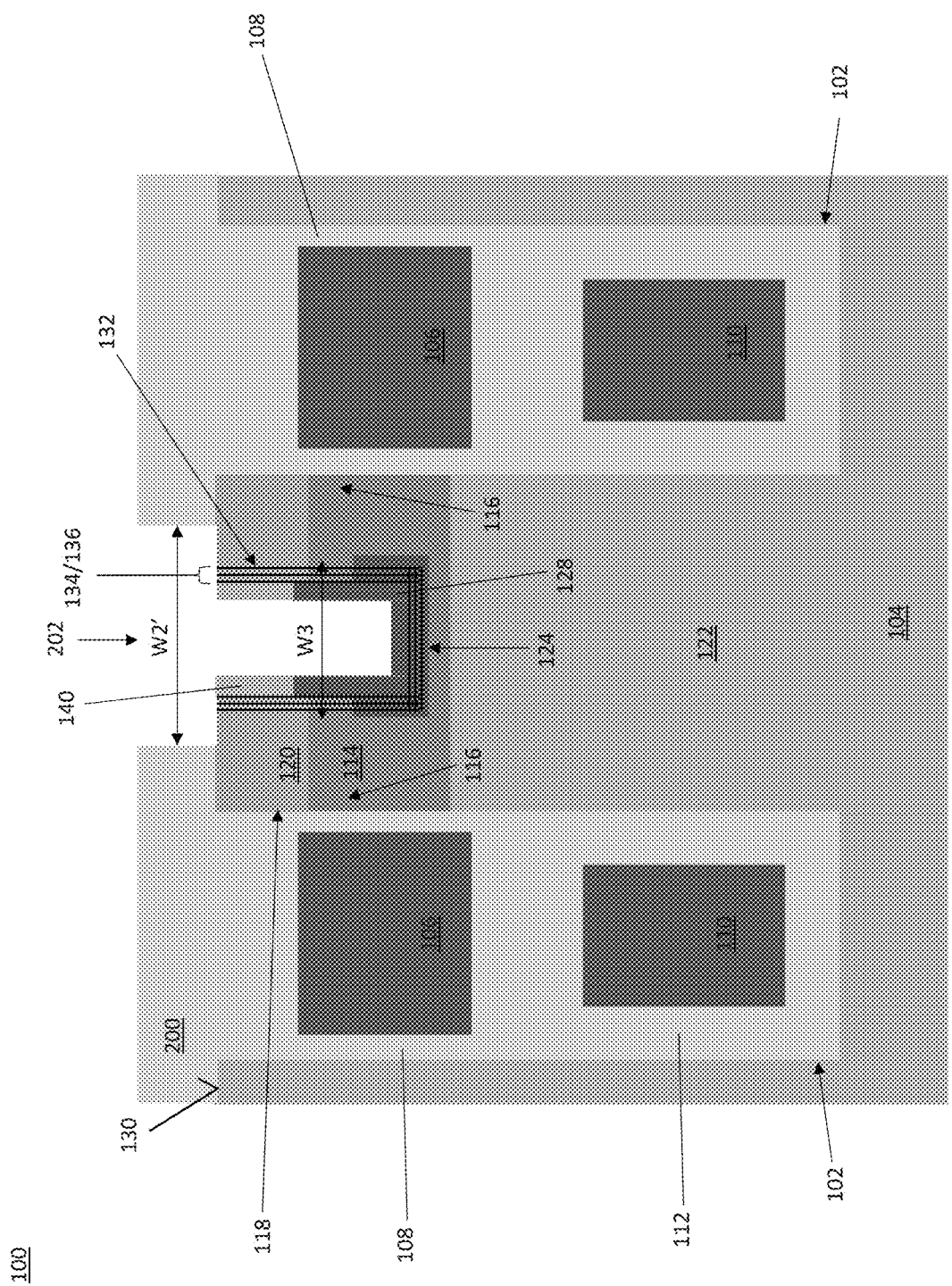

FIG. 2E shows the device 100 after the hard mask 200 is etched back to widen (W2') the opening 202 in the mask 200. Any standard dielectric etch-back process may be used. The widened opening 202 in the hard mask 200 is aligned with the contact trench 124, and is wider than the combined width (W3) of the contact trench 124 and the diffusion barrier structure 132.

Figure 2F:
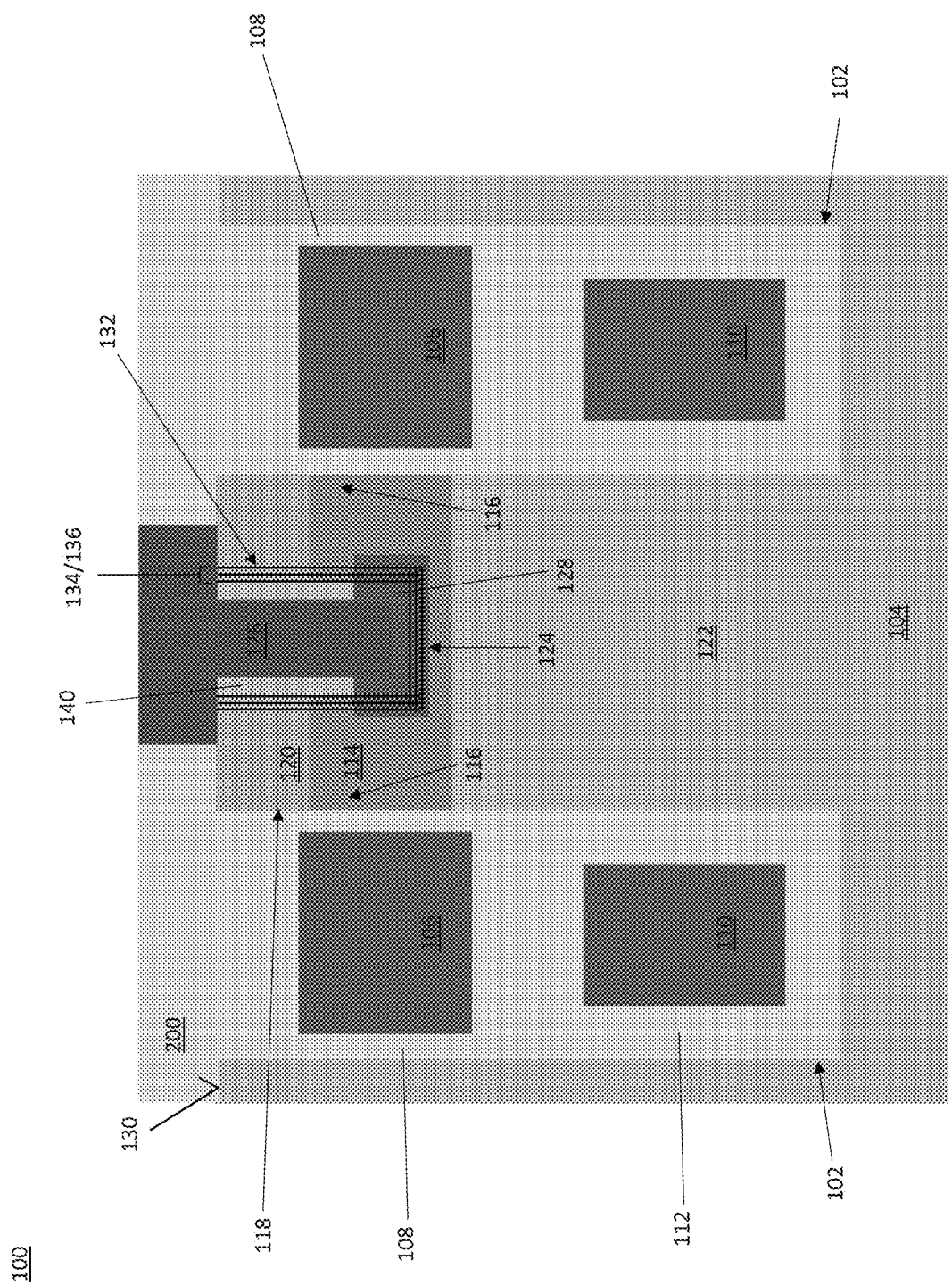

FIG. 2F shows the device after the contact trench 124 is filled with an electrically conductive material 126. The electrically conductive material 126 contacts the source region 120 at the sidewall of the contact trench 124 and the highly doped body contact region 128 at the bottom of the contact trench 124. The electrically conductive material 126 may extend onto the front main surface 130 of the Si substrate 104 beyond the diffusion barrier structure 132 and in a direction toward the gate trench 102, e.g., if the opening 202 in the hard mask 200 was widened previously as shown in FIG. 2E.

Figure 3:
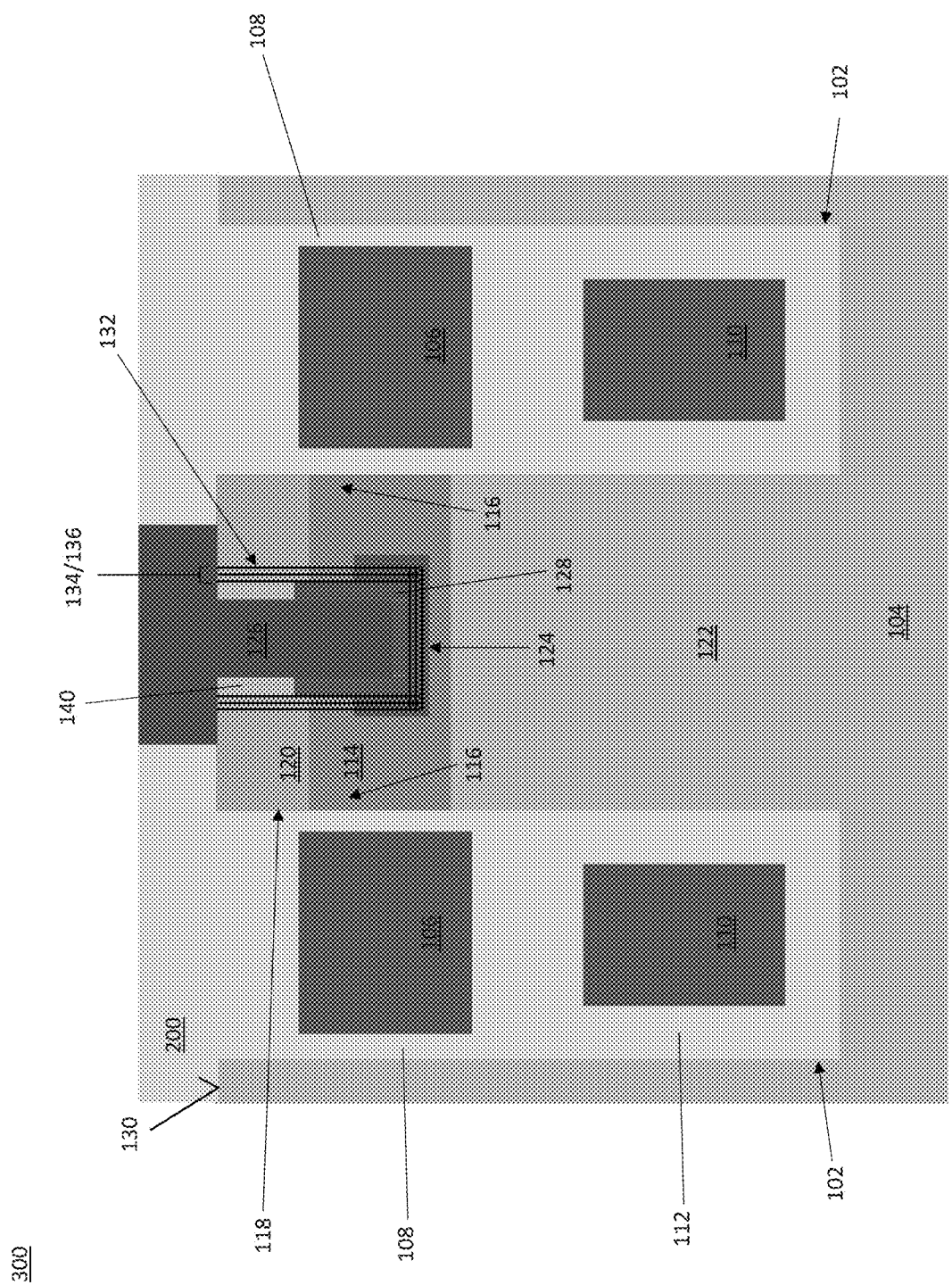
FIG. 3 illustrates a partial cross-sectional view of another embodiment of a trench-based semiconductor device having a diffusion barrier structure.

FIG. 3 illustrates a partial cross-sectional view of another embodiment of a trench-based semiconductor device 300. The embodiment shown in FIG. 3 is similar to the embodiment shown in FIG. 1. Different, however, the implanted and activated body contact dopants in the capping layer 140 of the diffusion barrier structure 132 extend into the source region 120 of the device 300.

Figure 4:
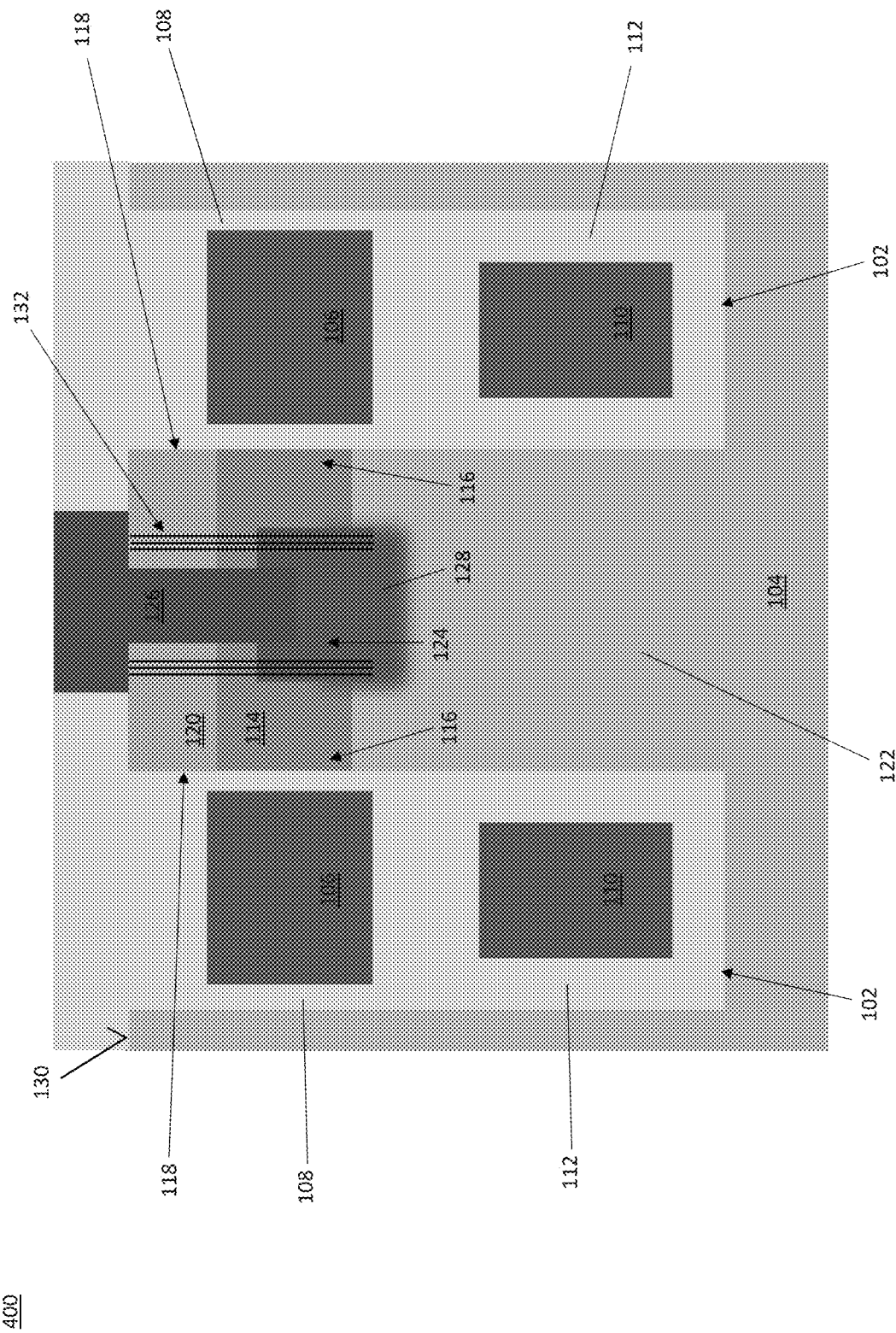
FIG. 4 illustrates a partial cross-sectional view of another embodiment of a trench-based semiconductor device having a diffusion barrier structure.

FIG. 4 illustrates a partial cross-sectional view of another embodiment of a trench-based semiconductor device 400. The embodiment shown in FIG. 4 is similar to the embodiments shown in FIGS. 1 and 3. Different, however, the diffusion barrier structure 132 is omitted from the bottom of the contact trench 124 and therefore does not limit the vertical out-diffusion of the source/body contact doping. According to this embodiment, dopant out-diffusion from the highly doped body contact region 128 is vertically directed deeper into the drift zone/Si substrate 122/104. The diffusion barrier structure 132 may be omitted from the bottom of the contact trench 132 by epitaxially growing the alternating layers of Si 134 and oxygen-doped Si 136 only on the sidewall and not the bottom of the contact trench 124. For example, a dielectric spacer (not shown) may be formed at the bottom of the contact trench 124 to prevent epitaxial growth of the diffusion barrier structure 132 at the trench bottom.

FIGS. 5A through 5D illustrate respective cross-sectional views of another embodiment of omitting the diffusion barrier structure 132 from at least part of the bottom of the contact trench 124.

Figure 5A:
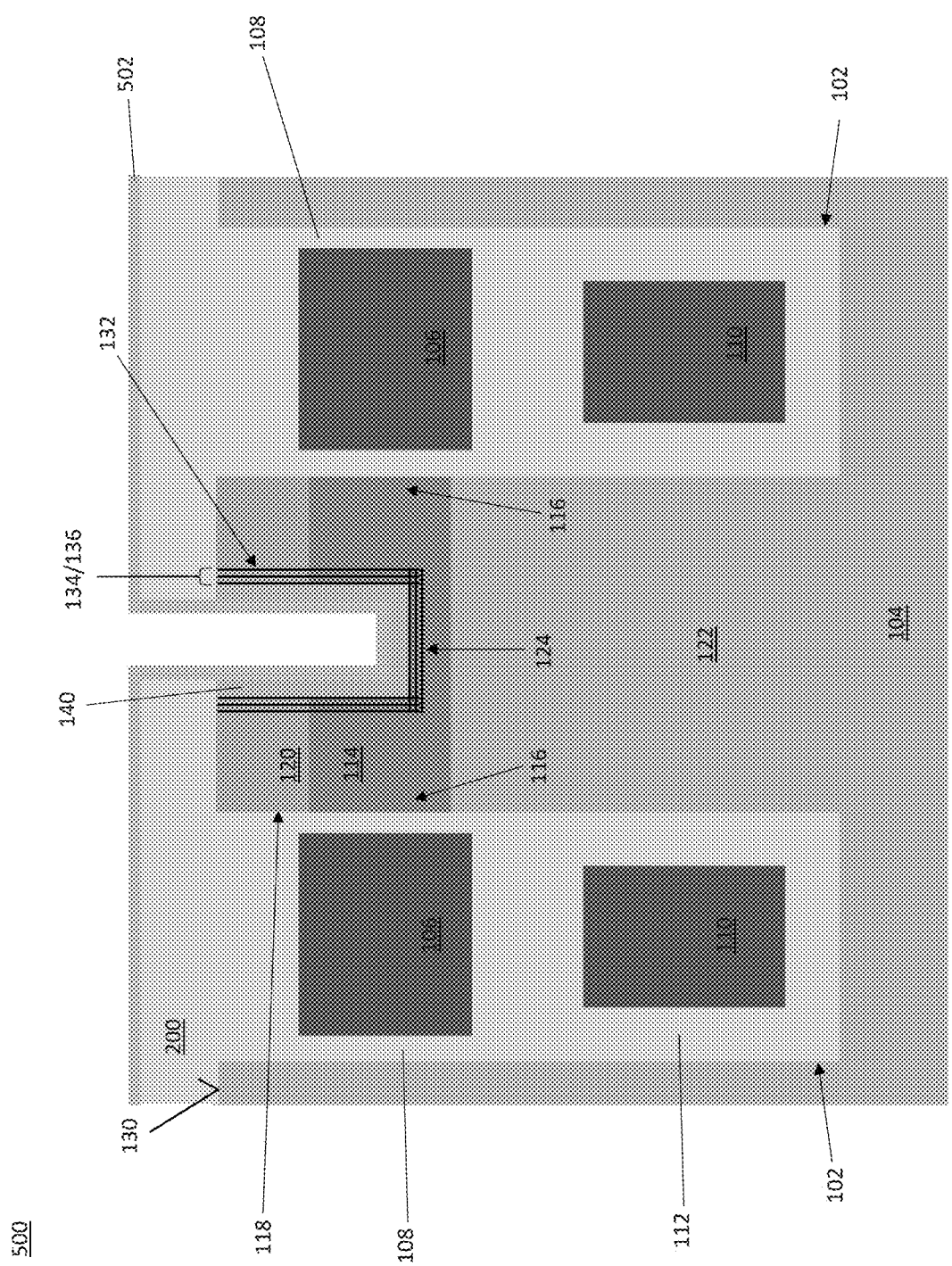
FIGS. 5A through 5D illustrate respective cross-sectional views of an embodiment of omitting the diffusion barrier structure from at least part of the bottom of a contact trench.

FIG. 5A shows the semiconductor device 500 after the diffusion barrier structure 132 is formed on the sidewall and bottom of the contact trench 124, e.g., as previously described herein in connection with FIG. 2C. A conformal spacer oxide 502 is also deposited on the capping layer 140 of Si of the diffusion barrier structure 132. If the capping layer 140 is omitted, the conformal spacer oxide 502 is deposited directly on the uppermost one of the alternating layers of Si 134 and oxygen-doped Si 136 of the diffusion barrier structure 132. In either case, any standard conformal spacer oxide may be used such as, e.g., silicon oxide.

Figure 5B:
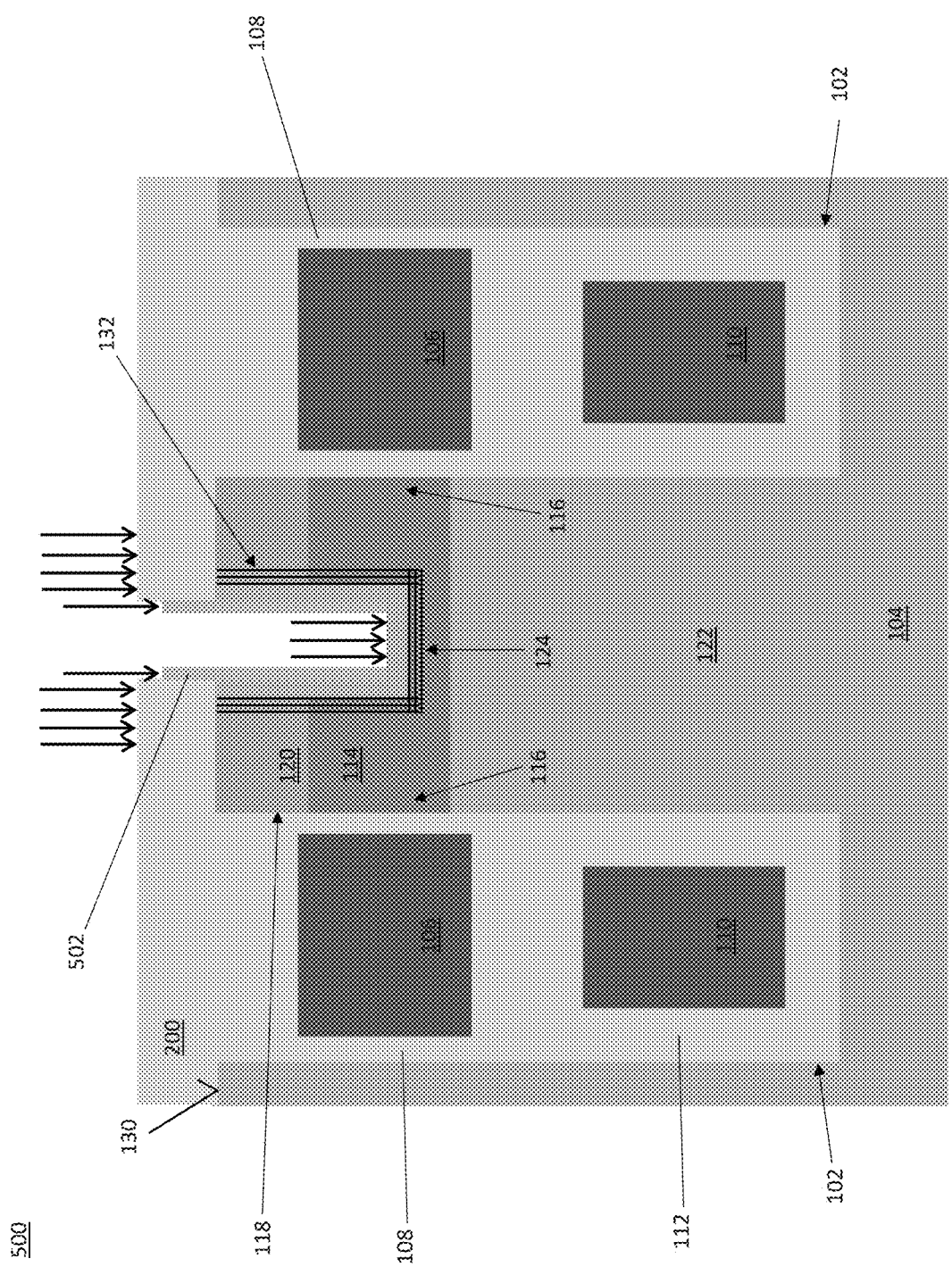

FIG. 5B shows the semiconductor device 500 during anisotropic etching of the conformal spacer oxide 502 from the top to expose the diffusion barrier structure 132 at the bottom of the contact trench 124. The anisotropic etching is represented by the downward facing arrows in FIG. 5B. If the capping layer 140 of Si is provided, the capping layer 140 would be exposed at the bottom of the contact trench 124. Otherwise, the uppermost one of the alternating layers of Si 134 and oxygen-doped Si 136 would be exposed. Any standard dielectric anisotropic etching process may be used to remove the conformal spacer oxide 502 from the bottom of the contact trench 124.

Figure 5C:
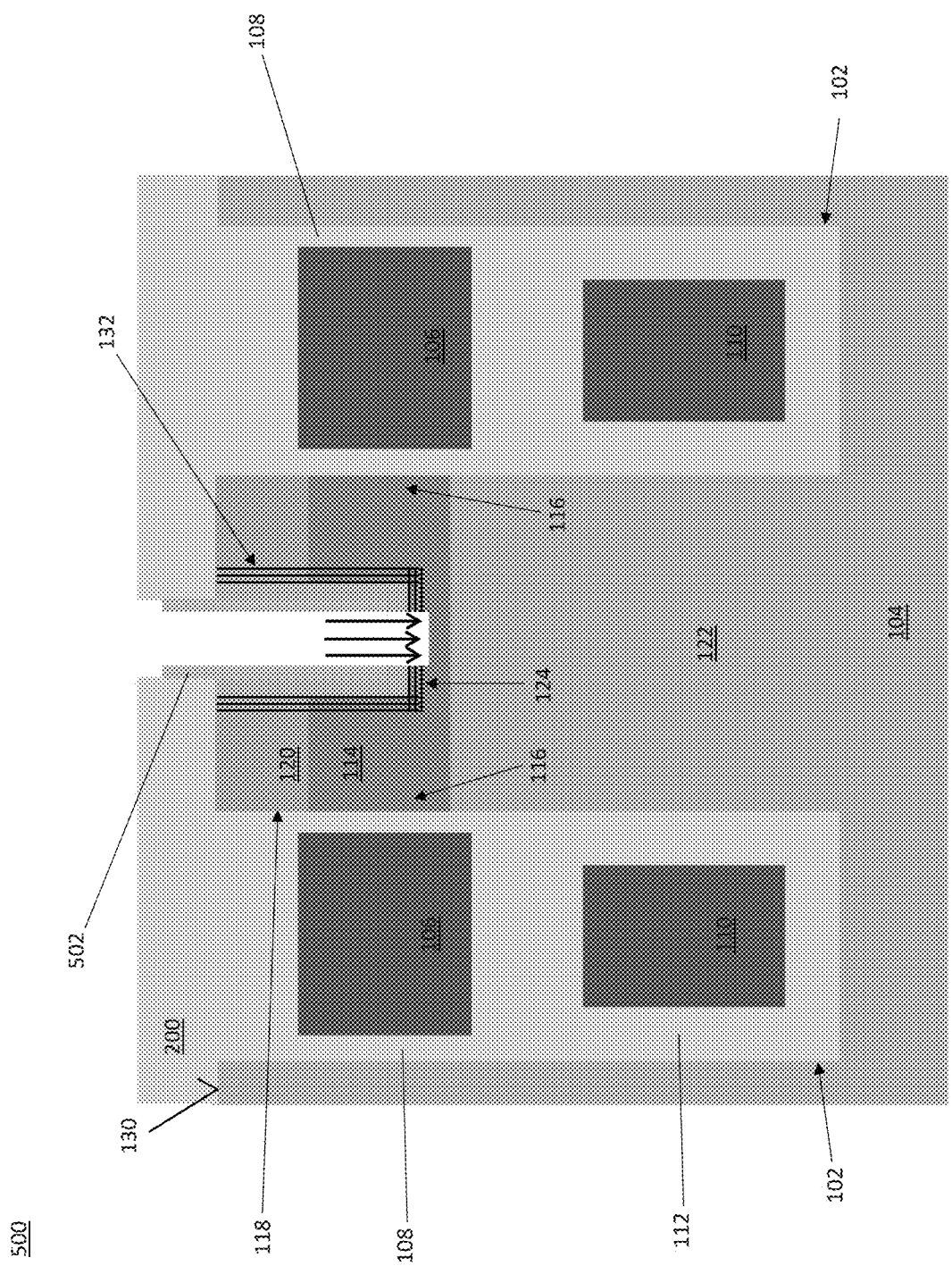

FIG. 5C shows the semiconductor device 500 during etching away of the exposed diffusion barrier structure 132 at the bottom of the contact trench 124. The Si etching is represented by the downward facing arrows in FIG. 5C. Any standard Si etching process may be used.

Figure 5D:
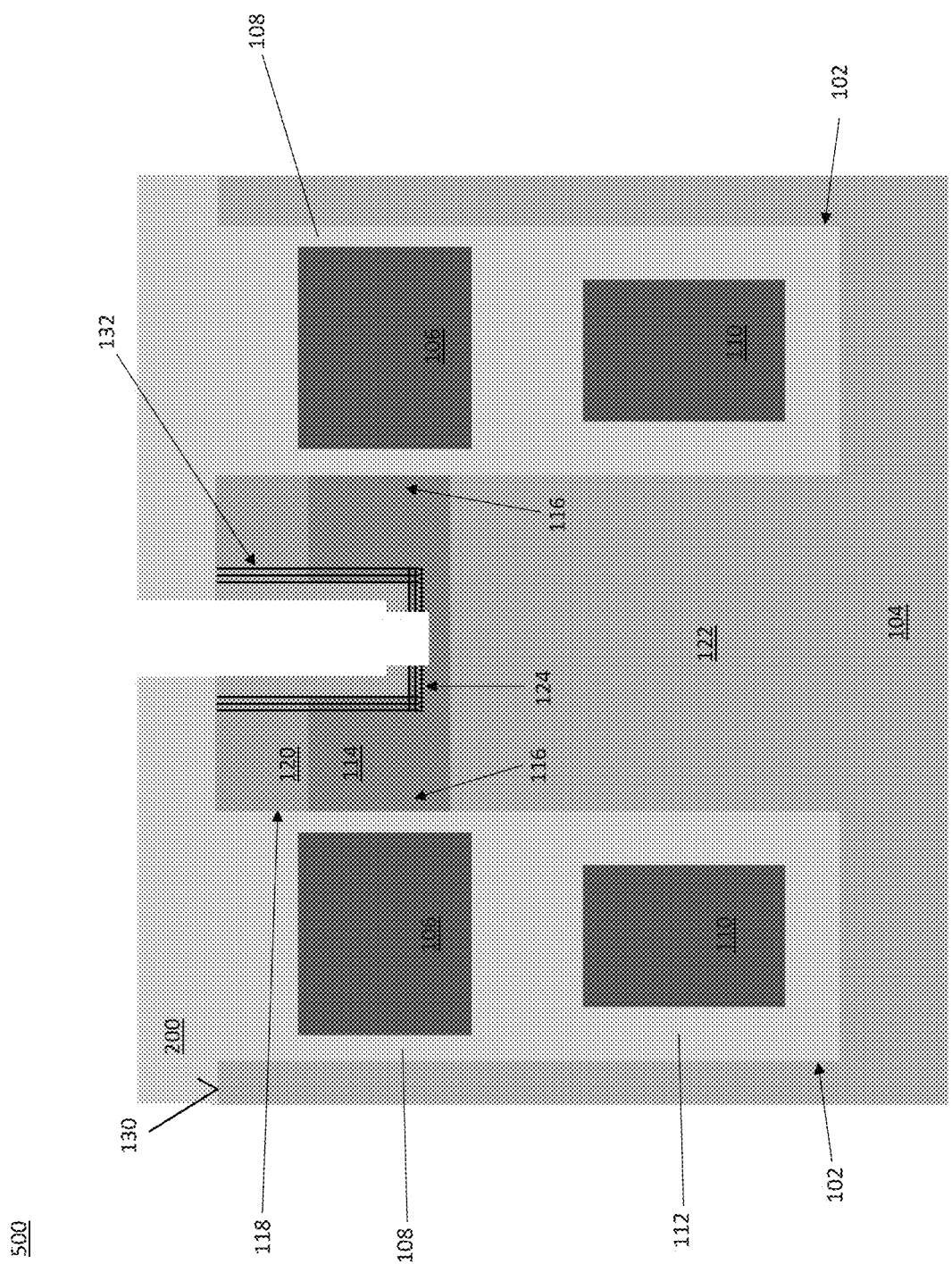

FIG. 5D shows the semiconductor device 500 after the exposed diffusion barrier structure 132 is etched away at the bottom of the contact trench 124 and after removal of the conformal spacer oxide 502. Any standard dielectric removal process, e.g. isotropic etching, may be used to remove the conformal oxide spacer 502 after the exposed diffusion barrier structure 132 is etched away at the bottom of the contact trench 124. Processing of the device 500 then continues to form a highly doped body contact region at the bottom of the contact trench 124, fill the contact trench 124, etc., e.g., as illustrated in FIGS. 2D through 2F.

FIGS. 6A through 6L illustrate respective partial cross-sectional views of a trench-based semiconductor device 600 during different stages of a manufacturing process in which the diffusion barrier structure 132 is formed before the body and the source regions 114, 120.

Figure 6A:
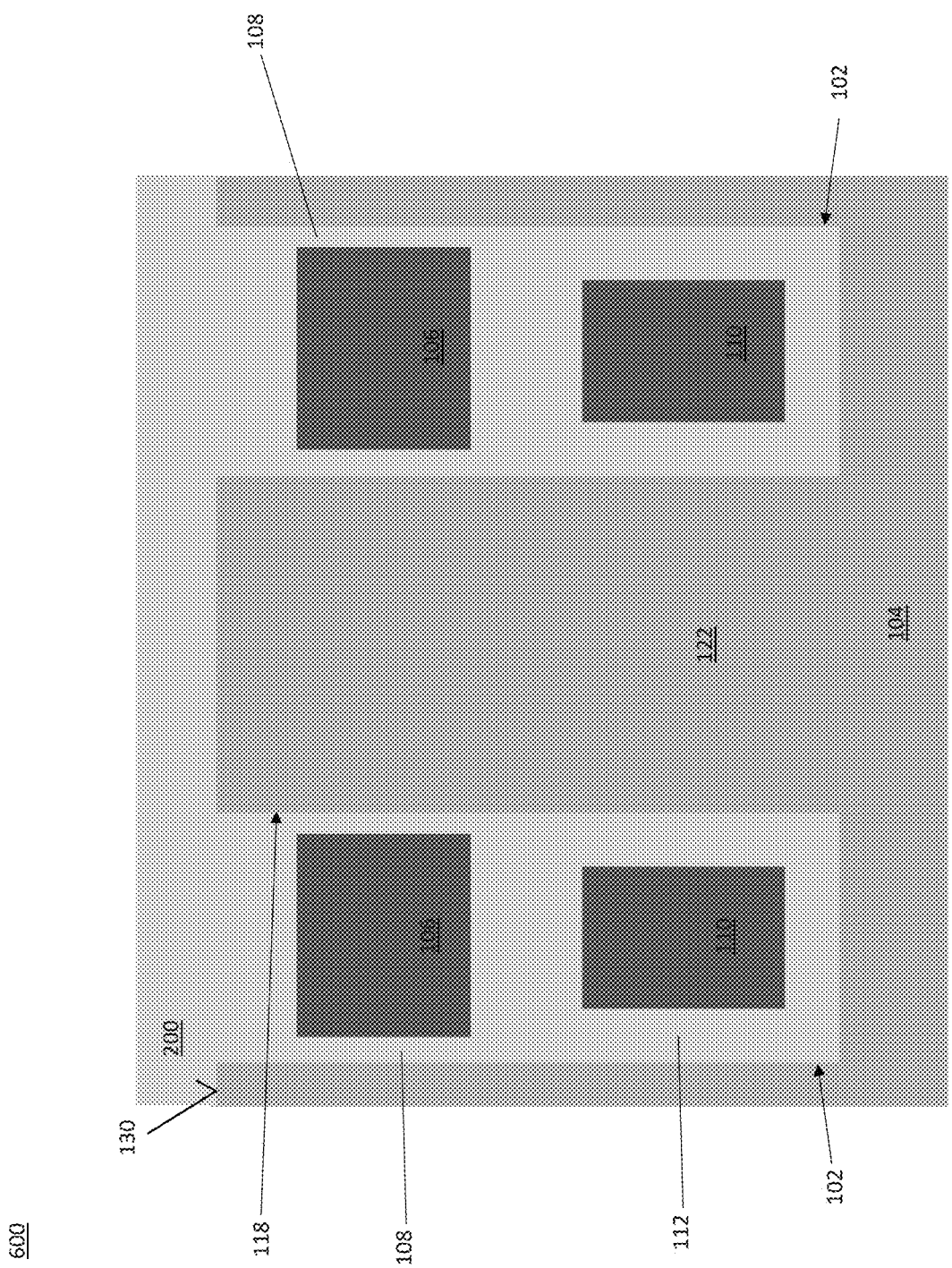
FIGS. 6A through 6L illustrate respective partial cross-sectional views of a trench-based semiconductor device during different stages of a manufacturing process in which the diffusion barrier structure is formed before body and source regions of the device.

FIG. 6A shows the semiconductor device 500 after gate trenches 102 are formed in the Si substrate 104 and after a hard mask/insulating layer 200 such as, e.g., silicon oxide is formed on the front main surface 130 of the Si substrate 104. Any common semiconductor manufacturing processes for forming gate trenches and a hard mask may be used, e.g., such as trench masking and etching, dielectric deposition and/or thermal oxidation, etc.

Figure 6B:
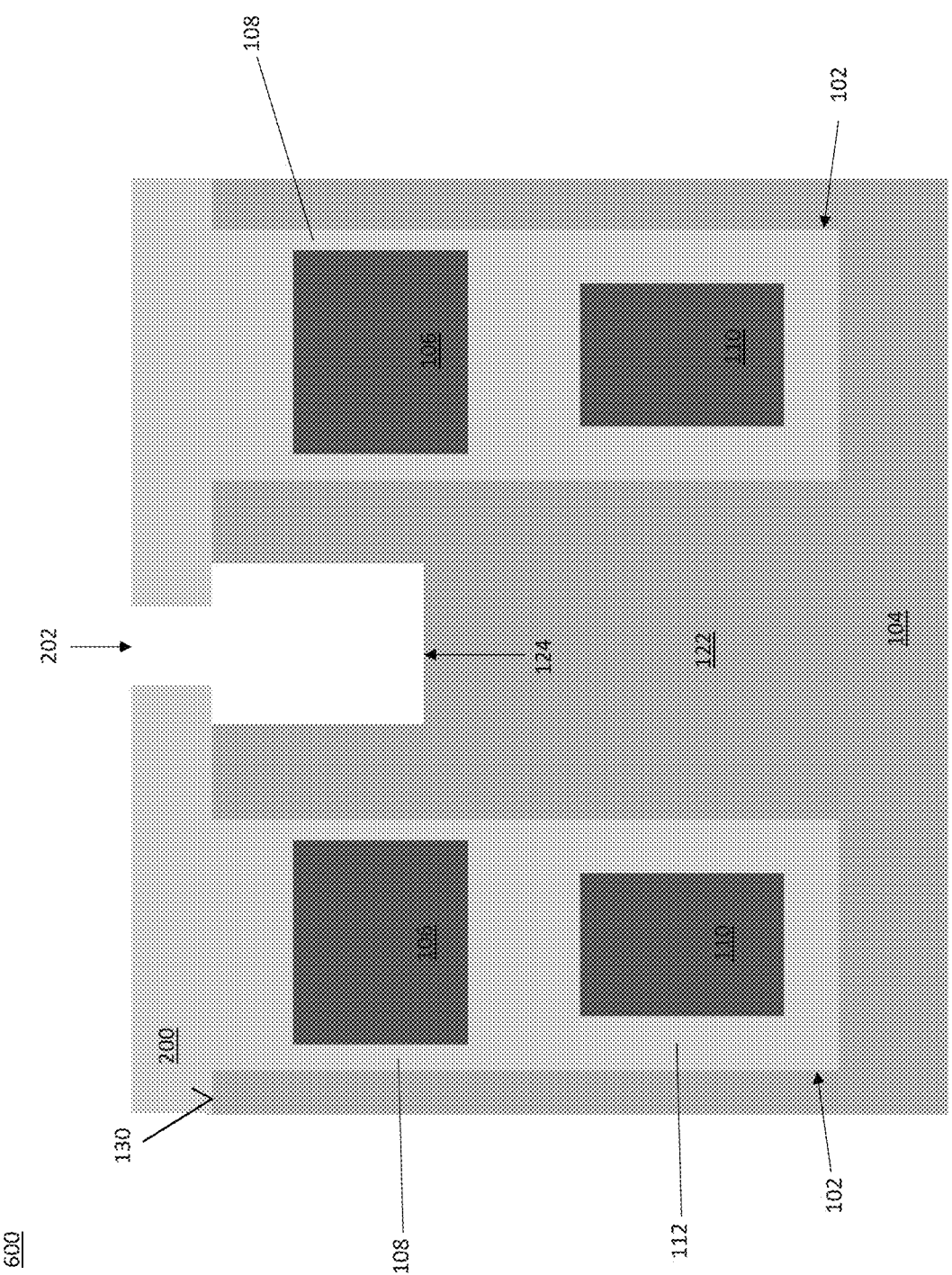

FIG. 6B shows the semiconductor device 600 after the contact trench 124 is etched into the Si substrate 104 between adjacent gate trenches 102. Any common trench etching process may be used to form the contact trench 124. For example, an opening 202 may be formed in the hard mask 200 on the front main surface 130 of the Si substrate 104 and the exposed part of the Si substrate 104 may be isotropically etched to form the contact trench 124 which is wider than the opening 202 in the hard mask 200.

Figure 6C:
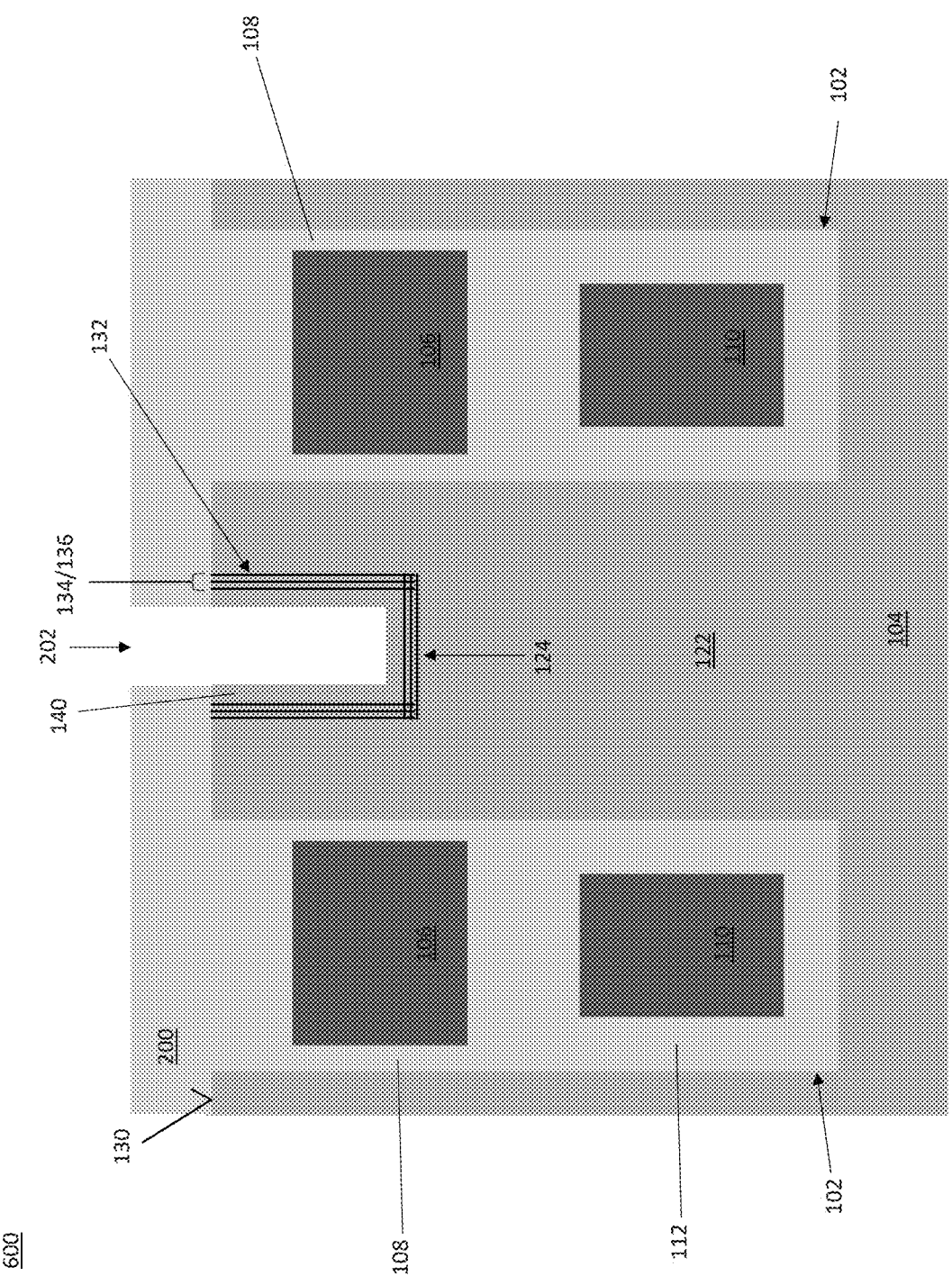

FIG. 6C shows the semiconductor device 600 after the diffusion barrier structure 132 is epitaxially grown on the sidewall and bottom of the contact trench 124, e.g., as previously described herein in connection with FIG. 2C. A capping layer 140 of Si may be epitaxially grown on the alternating layers of Si 134 and oxygen-doped Si 136. Alternatively, the capping layer 140 of Si may be omitted.

Figure 6D:
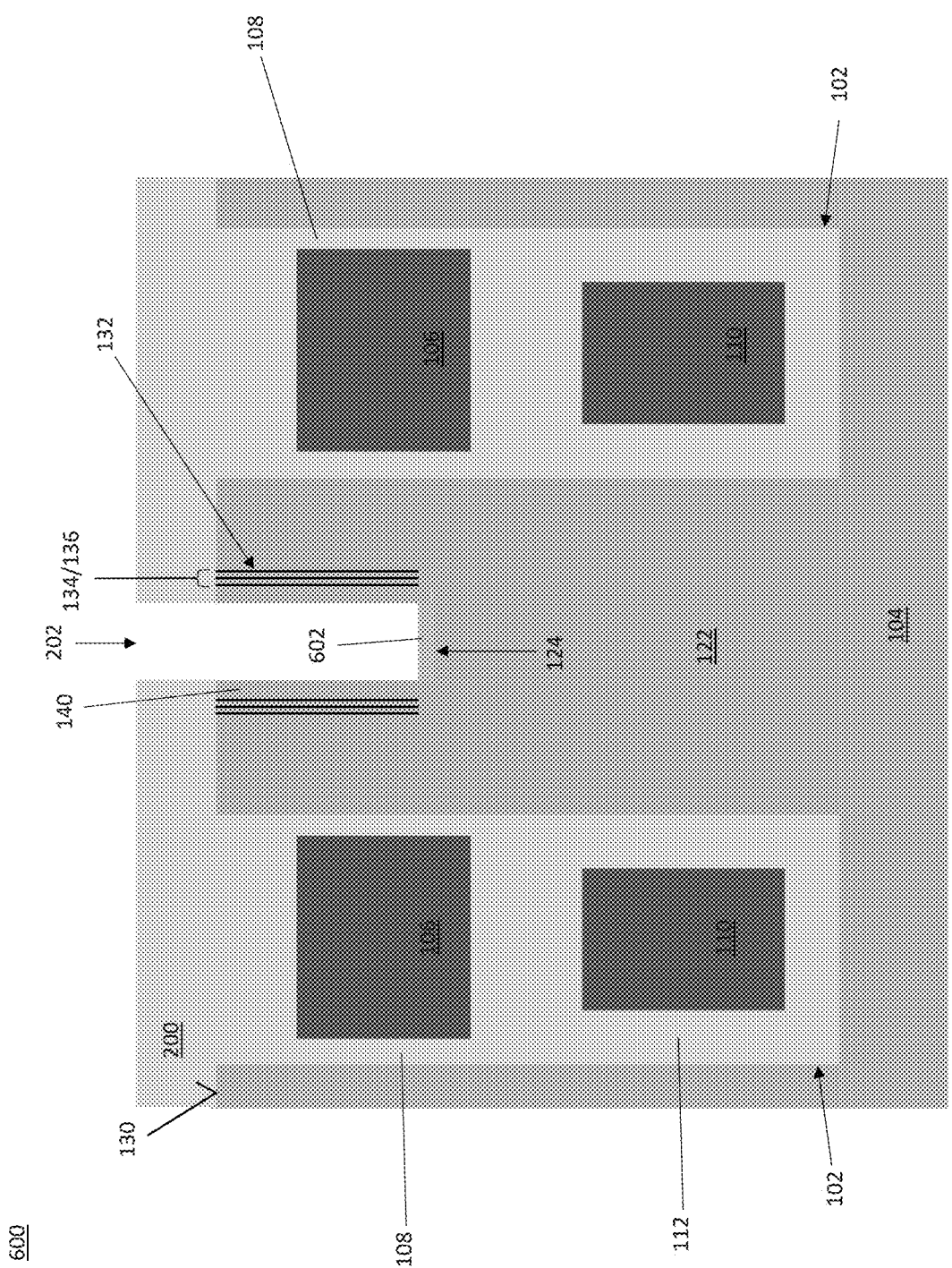

FIG. 6D shows an alternative embodiment in which the diffusion barrier structure 132 is omitted from the bottom of the contact trench 124. The diffusion barrier structure 132 may be partly or completely omitted from the bottom of the contact trench 124. For example, the diffusion barrier structure 132 may be omitted from the bottom of the contact trench 124 by epitaxially growing the alternating layers of Si 134 and oxygen-doped Si 136 only on the sidewall and not the bottom of the contact trench 124. A dielectric spacer may be formed at the bottom of the contact trench 124 to prevent epitaxial growth of the diffusion barrier structure 132 at the trench bottom.

In one embodiment, a sacrificial insulating layer 602 is formed at the bottom of the contact trench 124. After forming the sacrificial insulating layer 602, the alternating layers of Si 134 and oxygen-doped Si 136 are epitaxially grown only on the sidewall of the contact trench 132. After epitaxially growing the alternating layers of Si 134 and oxygen-doped Si 136, the sacrificial insulating layer 602 is removed from the bottom of the contact trench 124.

In another embodiment, the alternating layers of Si 134 and oxygen-doped Si 136 may be grown on the sidewall and bottom of the contact trench 124 and then removed from part or all of the trench bottom, e.g., as previously described herein in connection with FIGS. 5A through 5D.

FIGS. 6E through 6L illustrate the part of the diffusion barrier structure 132 disposed along the bottom of the contact trench 124 with dashed lines to indicate that the diffusion barrier structure 132 may or may not be present at the bottom of the contact trench 124.

Figure 6E:
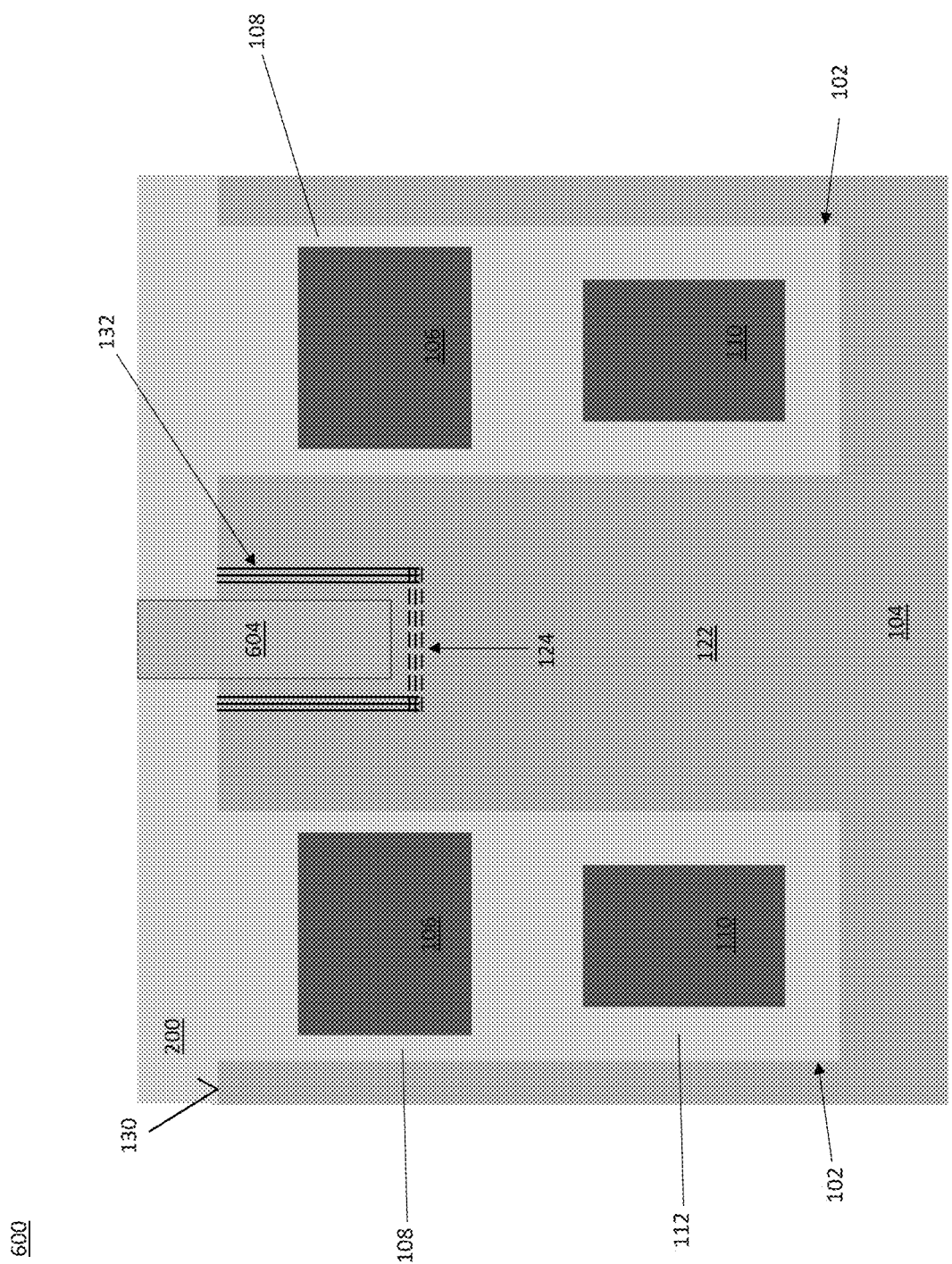

FIG. 6E shows the semiconductor device 600 after the contact trench 124 is filled with a sacrificial plug material 604, e.g., such as carbon or another material that is selectively etchable to the material of the hard mask 200 formed on the front main surface 130 of the Si substrate 104.

Figure 6F:
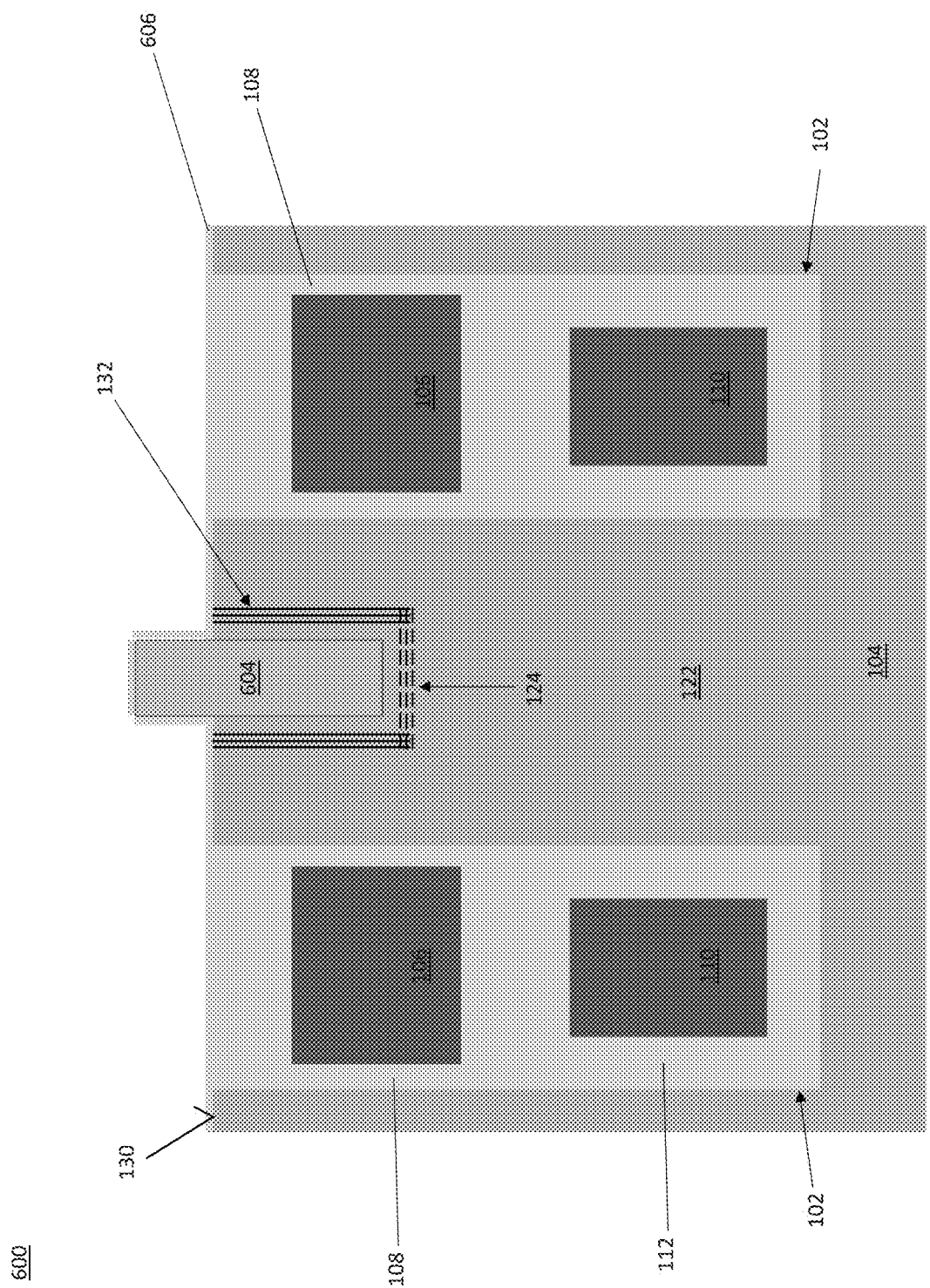

FIG. 6F shows the semiconductor device 600 after etchback of the hard mask 200 followed by formation of a screen oxide 606.

Figure 6G:
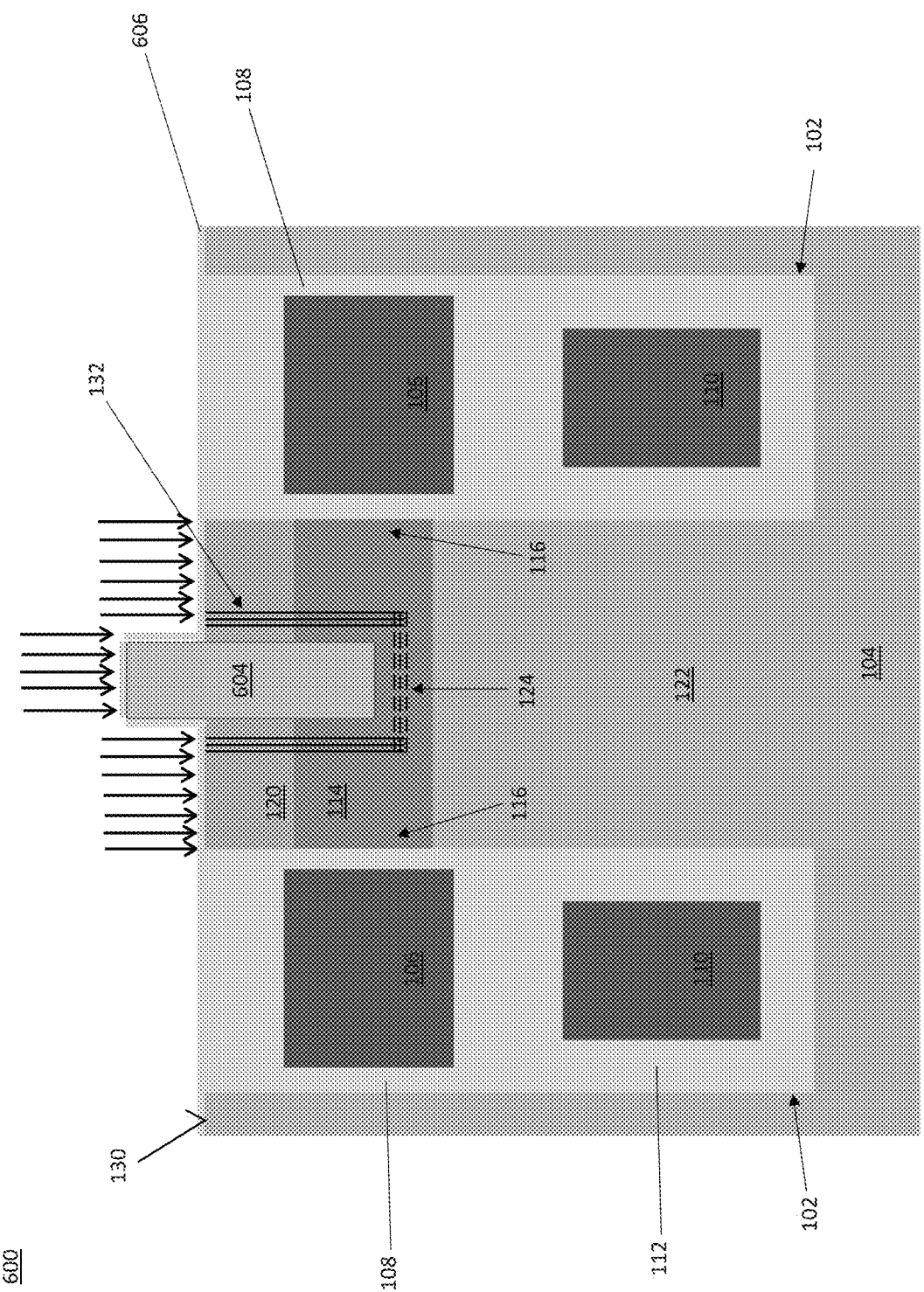

FIG. 6G shows the semiconductor device 600 after the body and source regions 114, 120 are formed in the Si substrate 104, e.g., by dopant implantation and activation by annealing. Dopants of the opposite conductivity type are used to form the body and source regions 114, 120. The dopants are implanted and then activated by annealing to form the body and source regions 114, 120. The dopant implantation is represented by the downward facing arrows in FIG. 6G. If the diffusion barrier structure 132 is omitted from the bottom of the contact trench 124, the dopant species may be implanted directly into the Si substrate 104 at the bottom of the contact trench 124 which is devoid of the alternating layers of Si 134 and oxygen-doped Si 136.

Figure 6H:
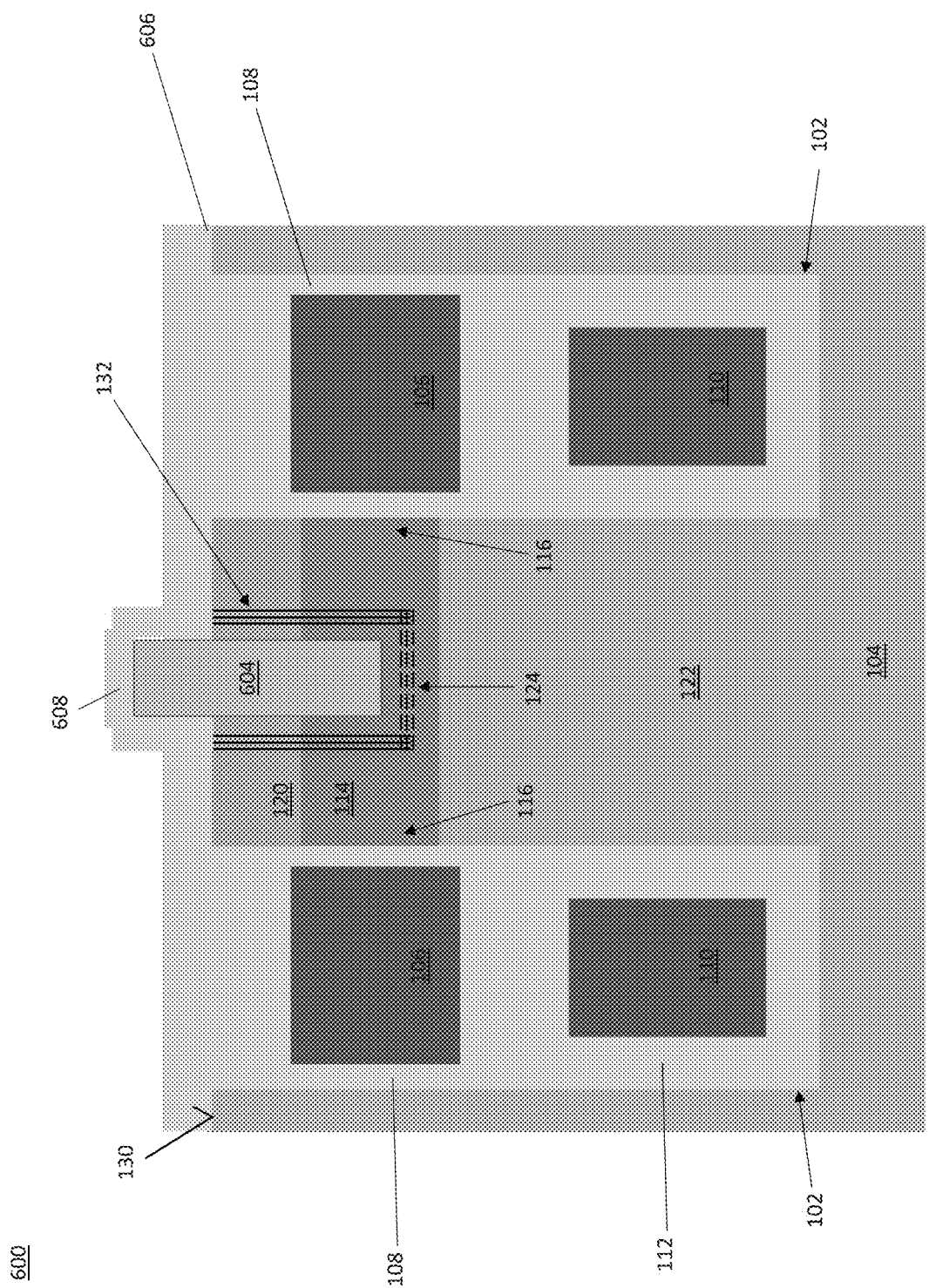

FIG. 6H shows the semiconductor device 600 after a mesa protection oxide 608 is deposited over the Si substrate 104.

Figure 6I:
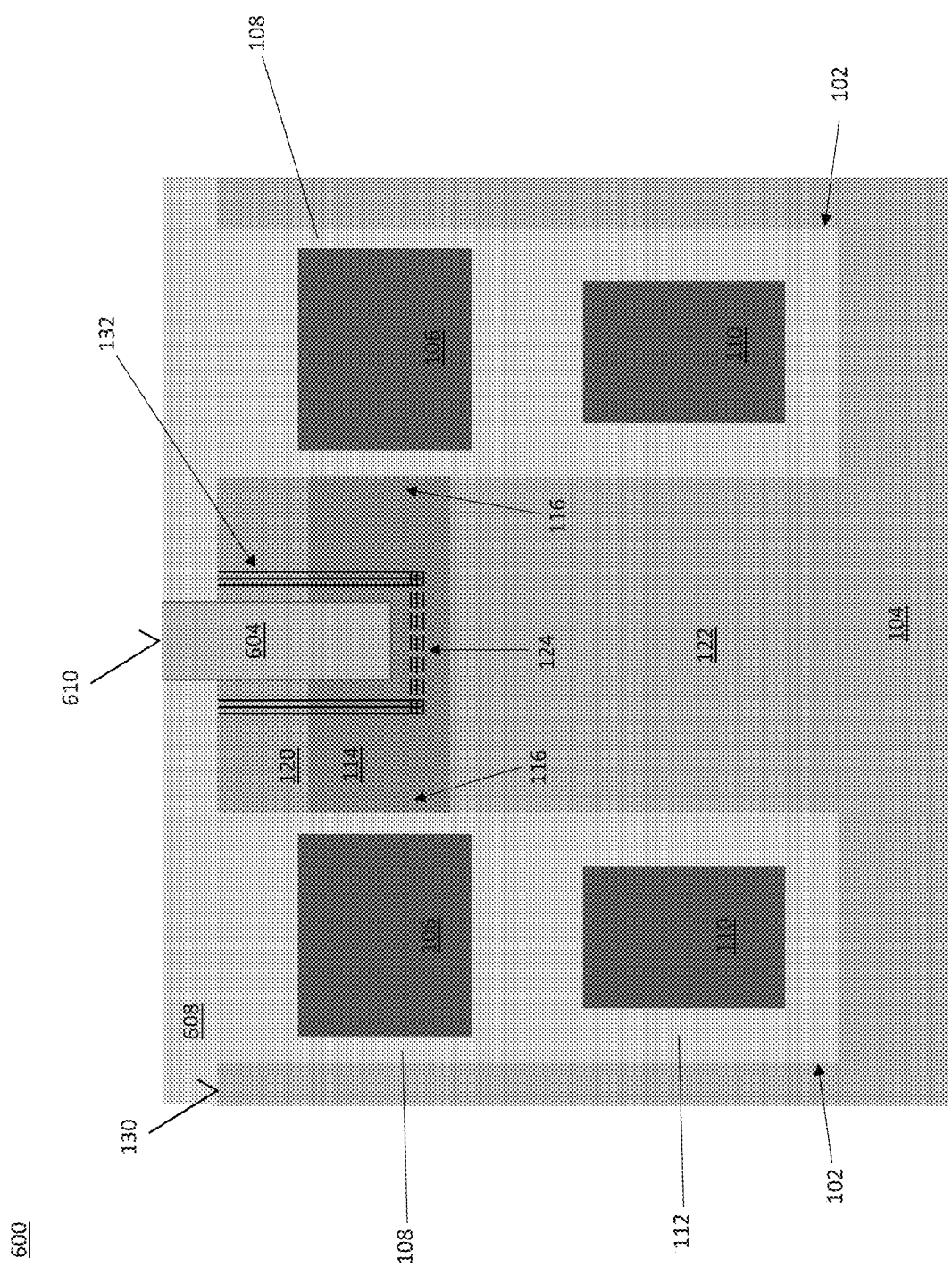

FIG. 6I shows the semiconductor device 600 after the mesa protection oxide 608 is planarized and the top surface 610 of the sacrificial plug material 604 in the contact trench 124 is exposed. Any standard planarization process can be used, e.g., such as CMP (chemical-mechanical polishing).

Figure 6J:
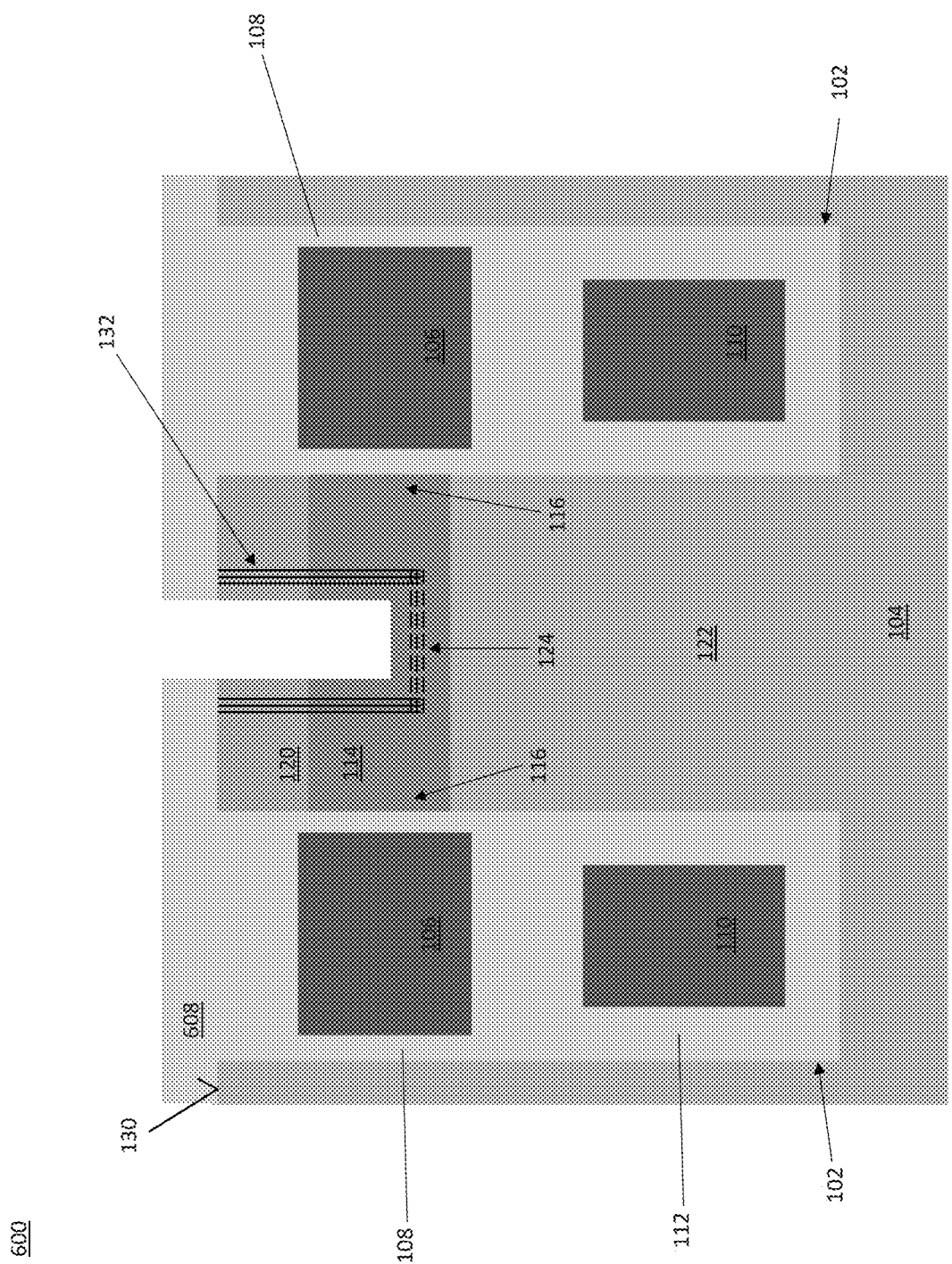

FIG. 6J shows the semiconductor device 600 after the sacrificial plug material 604 is removed from the contact trench 124. The process used to remove the sacrificial plug material 604 from the contact trench 124 depends on the type of plug material. For example, the process may involve wet and/or dry chemical etching.

Figure 6K:
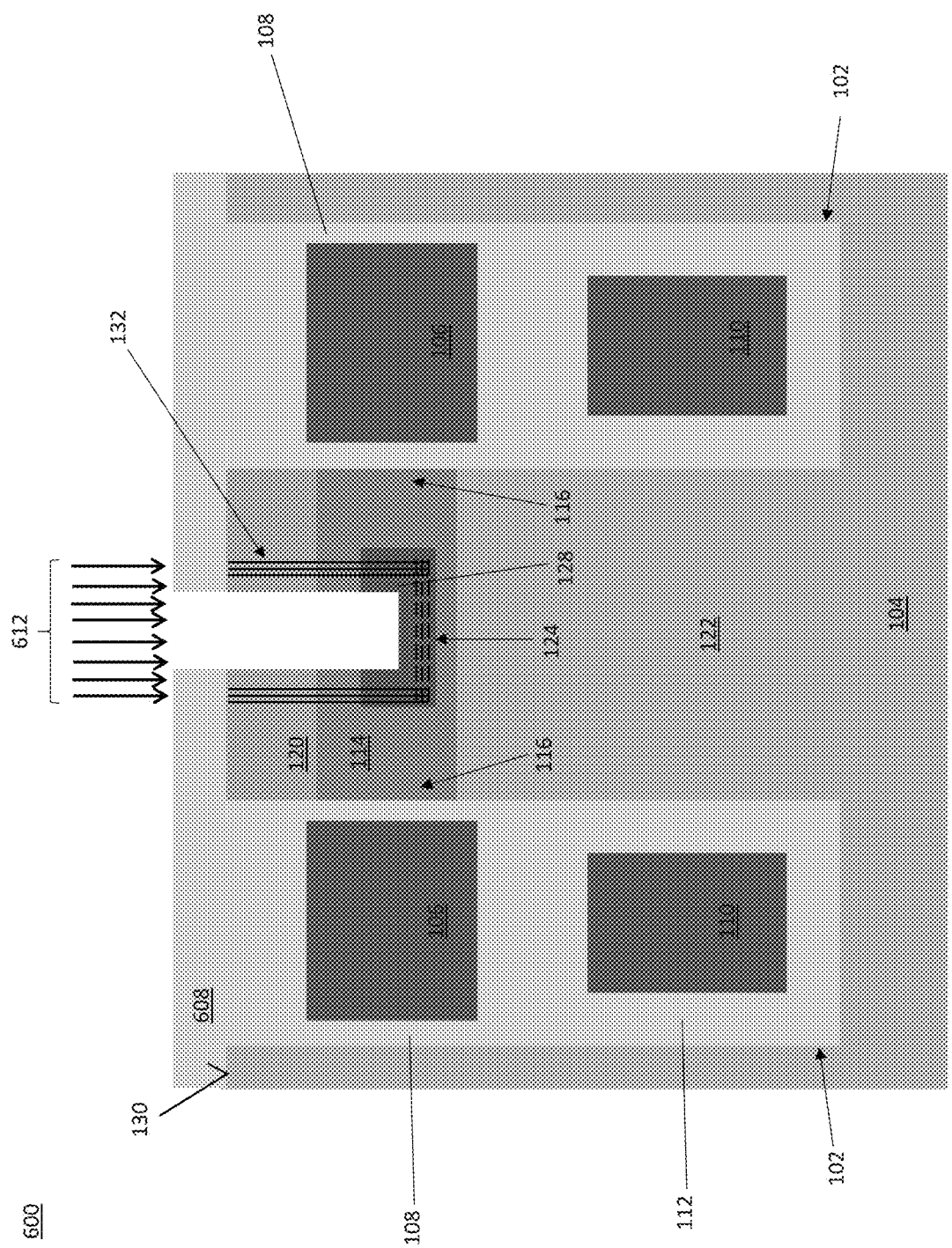

FIG. 6K shows the semiconductor device 600 during implantation of a dopant species 612 into the bottom of the contact trench 124. The dopant type (p-type or n-type) is the same as the dopant type of the body region 114, but at a higher concentration to form an ohmic contact. The Si substrate 104 is annealed to activate the implanted dopant species 612 to form the highly doped body contact region 128 at the bottom of the contact trench 124. The oxygen-doped Si layers 136 of the diffusion barrier structure 132 limit at least lateral out-diffusion of the source/body contact doping in a direction toward the vertical channel region 116. If the diffusion barrier structure 132 is present at the bottom of the contact trench 124, the oxygen-doped Si layers 136 of the diffusion barrier structure 132 also limit the vertical out-diffusion of the source/body contact doping in a direction toward the drift zone 122.

Figure 6L:
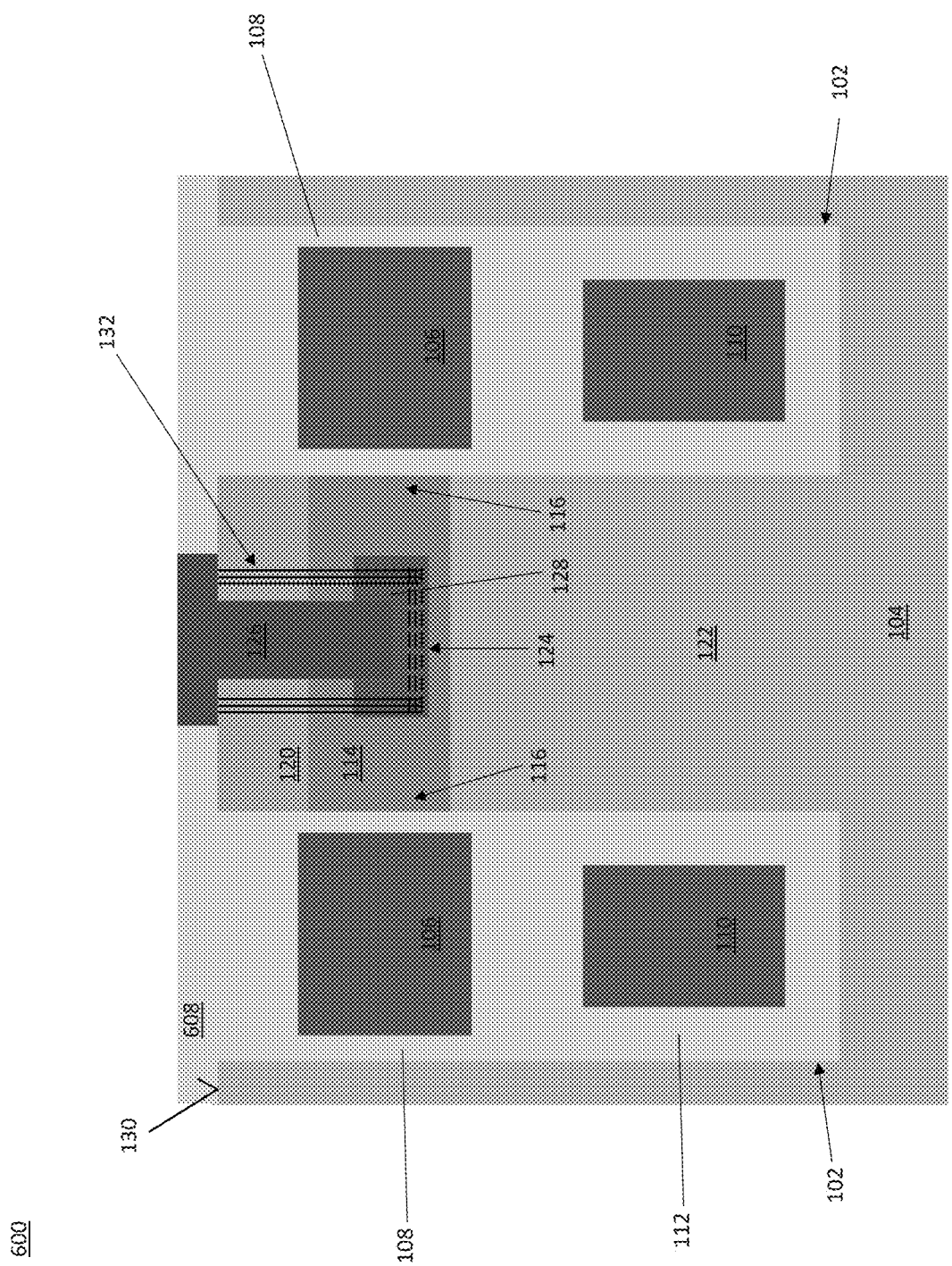

FIG. 6L shows the semiconductor device 600 after the contact trench 124 is filled with an electrically conductive material 126. The electrically conductive material 126 contacts the source region 120 at the sidewall of the contact trench 124 and the highly doped body contact region 128 at the bottom of the contact trench 124. The electrically conductive material 126 may extend onto the front main surface 130 of the Si substrate 104 beyond the diffusion barrier structure 132 and in a direction toward the gate trench 102 if the opening in the mesa protection oxide 608 is widened prior to deposition of the electrically conductive material 126, e.g., as shown in FIG. 2E.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a gate trench extending into a Si substrate;
   a body region in the Si substrate, the body region including a vertical channel region adjacent a sidewall of the gate trench;
   a source region in the Si substrate above the body region;
   a contact trench extending into the Si substrate and separated from the gate trench by a portion of the source region and by a portion of the body region;

an electrically conductive material in the contact trench; and a diffusion barrier structure interposed between a sidewall of the contact trench and the vertical channel region, the diffusion barrier structure comprising alternating layers of Si and oxygen-doped Si and configured to increase carrier mobility within the vertical channel region.

2. The semiconductor device of claim 1, wherein the diffusion barrier structure extends along a bottom of the contact trench.

3. The semiconductor device of claim 1, further comprising a highly doped body contact region at a bottom of the contact trench, wherein the diffusion barrier structure is interposed between the highly doped body contact region and the vertical channel region.

4. The semiconductor device of claim 3, wherein the highly doped body contact region is only laterally confined by the diffusion barrier structure which is absent from the bottom of the contact trench.

5. The semiconductor device of claim 1, wherein the electrically conductive material in the contact trench extends onto a front main surface of the Si substrate beyond the diffusion barrier structure and in a direction toward the gate trench.

6. The semiconductor device of claim 1, wherein the diffusion barrier structure comprises a capping layer of Si epitaxially grown on the alternating layers of Si and oxygen-doped Si.

7. A method of manufacturing a semiconductor device, the method comprising:
    forming a gate trench which extends into a Si substrate;
    forming a contact trench which extends into the Si substrate and is separate from the gate trench;
    forming a body region and a source region above the body region in the Si substrate, the body region including a vertical channel region adjacent a sidewall of the gate trench;
    forming a diffusion barrier structure interposed between a sidewall of the contact trench and the vertical channel region, the diffusion barrier structure comprising alternating layers of Si and oxygen-doped Si and configured to increase carrier mobility within the vertical channel region; and
    filling the contact trench with an electrically conductive material.

8. The method of claim 7, wherein forming the diffusion barrier structure comprises:
    before filling the contact trench with the electrically conductive material, epitaxially growing the alternating layers of Si and oxygen-doped Si on the sidewall and a bottom of the contact trench.

9. The method of claim 8, further comprising:
    epitaxially growing a capping layer of Si on the alternating layers of Si and oxygen-doped Si.

10. The method of claim 8, further comprising:
    forming a highly doped body contact region at the bottom of the contact trench,
    wherein the diffusion barrier structure is interposed between the highly doped body contact region and the vertical channel region.

11. The method of claim 10, wherein forming the highly doped body contact region comprises:
    implanting a dopant species into the alternating layers of Si and oxygen-doped Si at the bottom of the contact trench; and annealing the Si substrate to activate the implanted dopant species.

12. The method of claim 8, further comprising:
    removing the alternating layers of Si and oxygen-doped Si from at least part of the bottom of the contact trench.

13. The method of claim 12, wherein removing the alternating layers of Si and oxygen-doped Si from at least part of the bottom of the contact trench comprises:
    epitaxially growing a capping layer of Si on the alternating layers of Si and oxygen-doped Si;
    depositing a conformal spacer oxide on the capping layer of Si;
    anisotropically etching the conformal spacer oxide to expose the diffusion barrier structure at the bottom of the contact trench;
    etching away the exposed diffusion barrier structure at the bottom of the contact trench; and
    after etching away the exposed diffusion barrier structure at the bottom of the contact trench, removing the conformal spacer oxide.

14. The method of claim 7, wherein forming the diffusion barrier structure comprises:
    before filling the contact trench with the electrically conductive material, epitaxially growing the alternating layers of Si and oxygen-doped Si only on the sidewall and not on a bottom of the contact trench.

15. The method of claim 14, further comprising:
    epitaxially growing a capping layer of Si on the alternating layers of Si and oxygen-doped Si.

16. The method of claim 7, further comprising:
    before filling the contact trench with the electrically conductive material, etching back an insulating layer formed on a front main surface of the Si substrate so that the insulating layer has an opening which is aligned with the contact trench and wider than a combined width of the contact trench and the diffusion barrier structure.

17. The method of claim 16, wherein filling the contact trench with the electrically conductive material comprises:
    depositing the electrically conductive material in the contact trench and in the opening formed in the insulating layer, so that the electrically conductive material extends onto the front main surface of the Si substrate beyond the diffusion barrier structure and in a direction toward the gate trench.

18. The method of claim 7, wherein forming the diffusion barrier structure comprises:
    before forming the body region and the source region, epitaxially growing the alternating layers of Si and oxygen-doped Si on the sidewall and a bottom of the contact trench.

19. The method of claim 18, further comprising:
    before forming the body region and the source region, epitaxially growing a capping layer of Si on the alternating layers of Si and oxygen-doped Si.

20. The method of claim 18, further comprising:
    removing the alternating layers of Si and oxygen-doped Si from at least part of the bottom of the contact trench.

21. The method of claim 20, wherein removing the alternating layers of Si and oxygen-doped Si from at least part of the bottom of the contact trench comprises:
    epitaxially growing a capping layer of Si on the alternating layers of Si and oxygen-doped Si;
    depositing a conformal spacer oxide on the capping layer of Si;

anisotropically etching the conformal spacer oxide to expose the diffusion barrier structure at the bottom of the contact trench;

etching away the exposed diffusion barrier structure at the bottom of the contact trench; and after etching away the exposed diffusion barrier structure at the bottom of the contact trench, removing the conformal spacer oxide.

22. The method of claim 7, wherein forming the diffusion barrier structure comprises:

before forming the body region and the source region, forming a sacrificial insulating layer at a bottom of the contact trench;

after forming the sacrificial insulating layer, epitaxially growing the alternating layers of Si and oxygen-doped Si on the sidewall of the contact trench; and after epitaxially growing the alternating layers of Si and oxygen-doped Si on the sidewall of the contact trench, removing the sacrificial insulating layer from the bottom of the contact trench.

23. The method of claim 7, further comprising:

after forming the diffusion barrier structure and before forming the body region and the source region, filling the contact trench with a sacrificial plug material;

after forming the body region and the source region, removing the sacrificial plug material;

after removing the sacrificial plug material and before filling the contact trench with the electrically conductive material, implanting a dopant species into a bottom of the contact trench; and annealing the Si substrate to activate the implanted dopant species to form a highly doped body contact region at the bottom of the contact trench.

* * * * *